(12) United States Patent
Nakanishi et al.

(10) Patent No.: US 9,152,416 B2
(45) Date of Patent: Oct. 6, 2015

(54) STORAGE CONTROL DEVICE, MEMORY SYSTEM, INFORMATION PROCESSING SYSTEM AND STORAGE CONTROL METHOD

(71) Applicant: Sony Corporation, Tokyo (JP)

(72) Inventors: Kenichi Nakanishi, Tokyo (JP); Keiichi Tsutsui, Kanagawa (JP); Yasushi Fujinami, Tokyo (JP); Naohiro Adachi, Tokyo (JP); Hideaki Okubo, Saitama (JP); Tatsuo Shinbashi, Tokyo (JP); Ken Ishii, Tokyo (JP)

(73) Assignee: Sony Corporation, Tokyo (JP)

( * ) Notice: Subject to any disclaimer, the term of this patent is extended or adjusted under 35 U.S.C. 154(b) by 197 days.

(21) Appl. No.: 13/790,438

(22) Filed: Mar. 8, 2013

(65) Prior Publication Data
US 2013/0282993 A1    Oct. 24, 2013

(30) Foreign Application Priority Data

Apr. 24, 2012    (JP) ................. 2012-098316

(51) Int. Cl.
| | |
|---|---|
| G06F 11/00 | (2006.01) |
| G06F 9/30 | (2006.01) |
| G11C 16/34 | (2006.01) |
| G11C 29/08 | (2006.01) |
| G11C 29/52 | (2006.01) |
| G11C 29/04 | (2006.01) |

(52) U.S. Cl.
CPC .......... *G06F 9/3004* (2013.01); *G11C 16/3418* (2013.01); *G11C 29/08* (2013.01); *G11C 29/52* (2013.01); *G11C 2029/0401* (2013.01)

(58) Field of Classification Search
CPC ............ G11C 13/003; G11C 13/0033; G11C 13/004; G11C 13/0069; G11C 13/0064; G06F 11/106
USPC .......... 714/14, 22, 24, 47.2, 47.3, 48; 711/114
See application file for complete search history.

(56) References Cited

U.S. PATENT DOCUMENTS

| | | | |
|---|---|---|---|
| 4,805,109 A * | 2/1989 | Kroll et al. ............... | 705/405 |
| 4,817,004 A * | 3/1989 | Kroll et al. ............... | 705/404 |
| 6,158,000 A * | 12/2000 | Collins .................... | 713/1 |
| 2004/0042269 A1* | 3/2004 | Tamura et al. ........... | 365/185.12 |
| 2004/0156251 A1* | 8/2004 | Shiota et al. ............ | 365/200 |
| 2005/0024974 A1* | 2/2005 | Noguchi et al. ......... | 365/230.03 |
| 2005/0044467 A1* | 2/2005 | Leung et al. ............ | 714/763 |
| 2010/0054017 A1* | 3/2010 | Maejima ................. | 365/148 |

(Continued)

FOREIGN PATENT DOCUMENTS

| | | |
|---|---|---|
| JP | 2004-220068 A | 8/2004 |
| WO | WO 2012172848 A1 * | 12/2012 |

*Primary Examiner* — Bryce Bonzo
*Assistant Examiner* — Jeison C Arcos
(74) *Attorney, Agent, or Firm* — Sony Corporation

(57) ABSTRACT

A storage control device includes a first rewriting section, a second rewriting section, and a first retry control section. The first rewriting section performs first rewrite to rewrite other of two binary values into a memory cell in which one of the two binary values is written. The second rewriting section performs second rewrite to rewrite the one of the two binary values into the memory cell in which the other of the two binary values is written. The first retry control section causes the memory cell that has undergone the first rewrite to be subjected to the second rewrite followed by the first rewrite again if an error occurs during the first rewrite.

12 Claims, 31 Drawing Sheets

(56) References Cited

U.S. PATENT DOCUMENTS

| | | | |
|---|---|---|---|
| 2010/0220517 A1* | 9/2010 | Okayama | 365/158 |
| 2010/0235714 A1* | 9/2010 | Toda | 714/763 |
| 2012/0069633 A1* | 3/2012 | Katoh | 365/148 |
| 2013/0329485 A1* | 12/2013 | Takashima et al. | 365/148 |
| 2015/0098261 A1* | 4/2015 | Tabata et al. | 365/63 |

\* cited by examiner

FIG.5

| BIT | NAME | DESCRIPTION |
|---|---|---|
| 7 | WP | 0=PROTECTED/1=NOT PROTECTED |
| 6 | RDY | 0=BUSY/1=READY |
| 5 | — | |
| 4 | — | |
| 3 | — | |
| 2 | — | |
| 1 | SET/RESET | 0=SET/1=RESET |
| 0 | ERROR | 0=NORMALLY TERMINATED/1=ERROR |

| LOGICAL ADDRESS | PHYSICAL ADDRESS | PHYSICAL ADDRESS STATUS (0: AVAILABLE, 1: DEFECTIVE) |
|---|---|---|
| pA1 | rA1 | 0 |
| pA2 | rA2 | 1 |
| pA3 | rA3 | 0 |
| ⋮ | ⋮ | ⋮ |

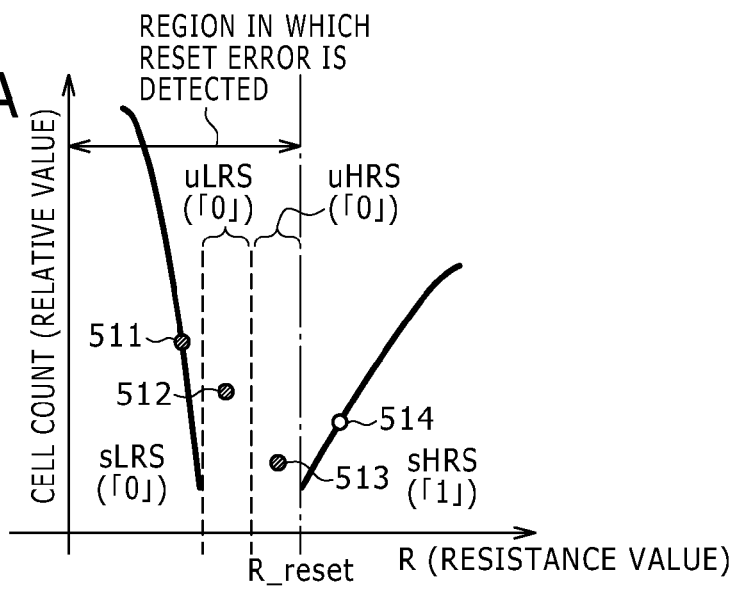
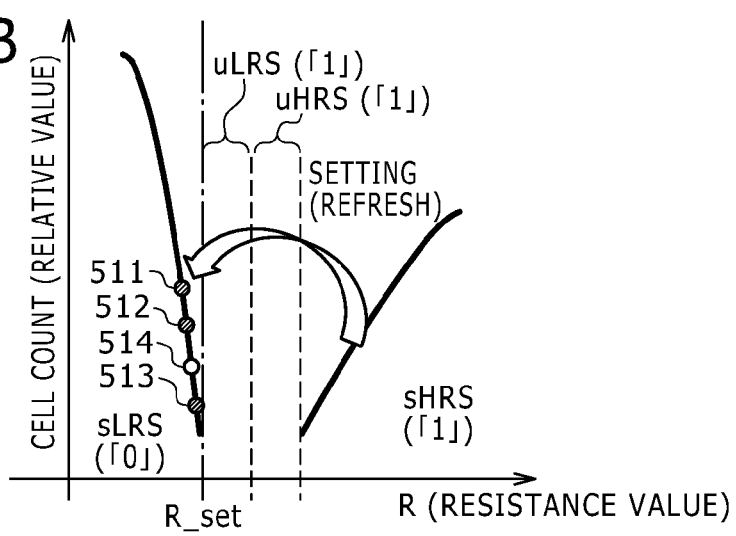
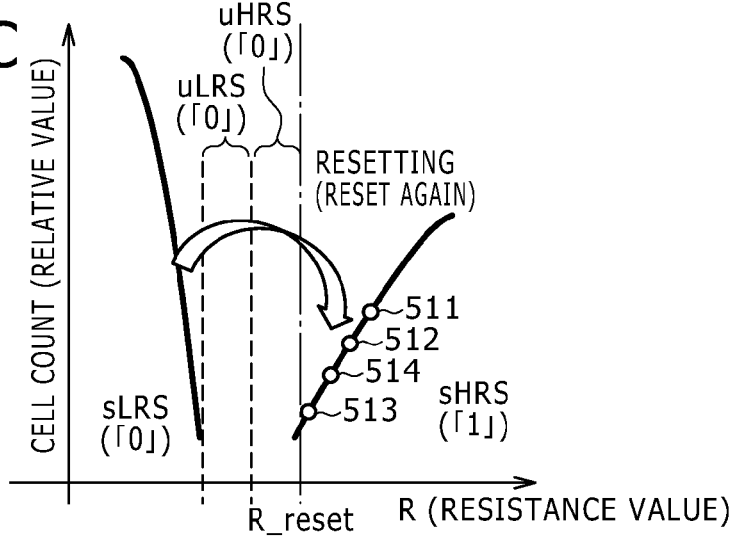

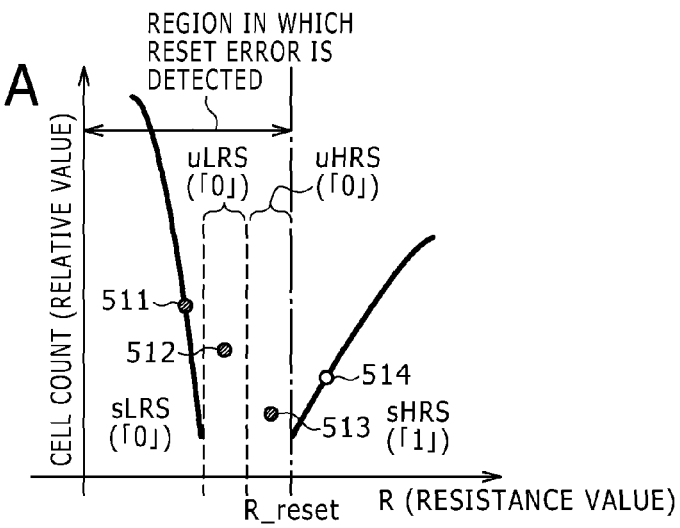
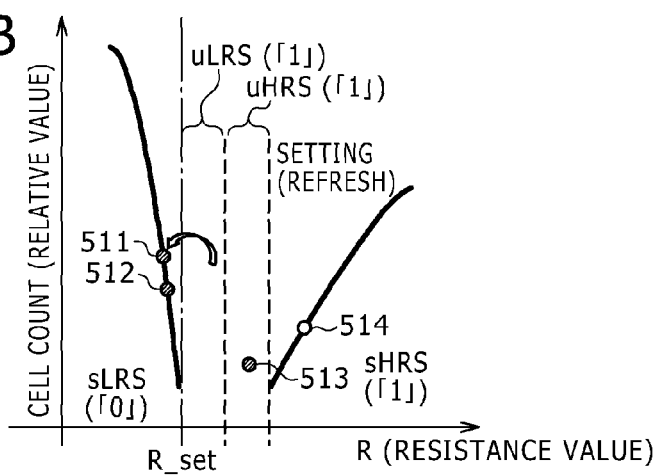
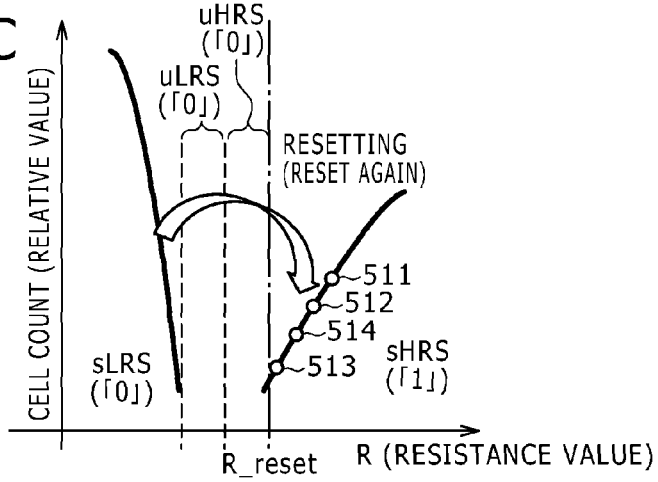

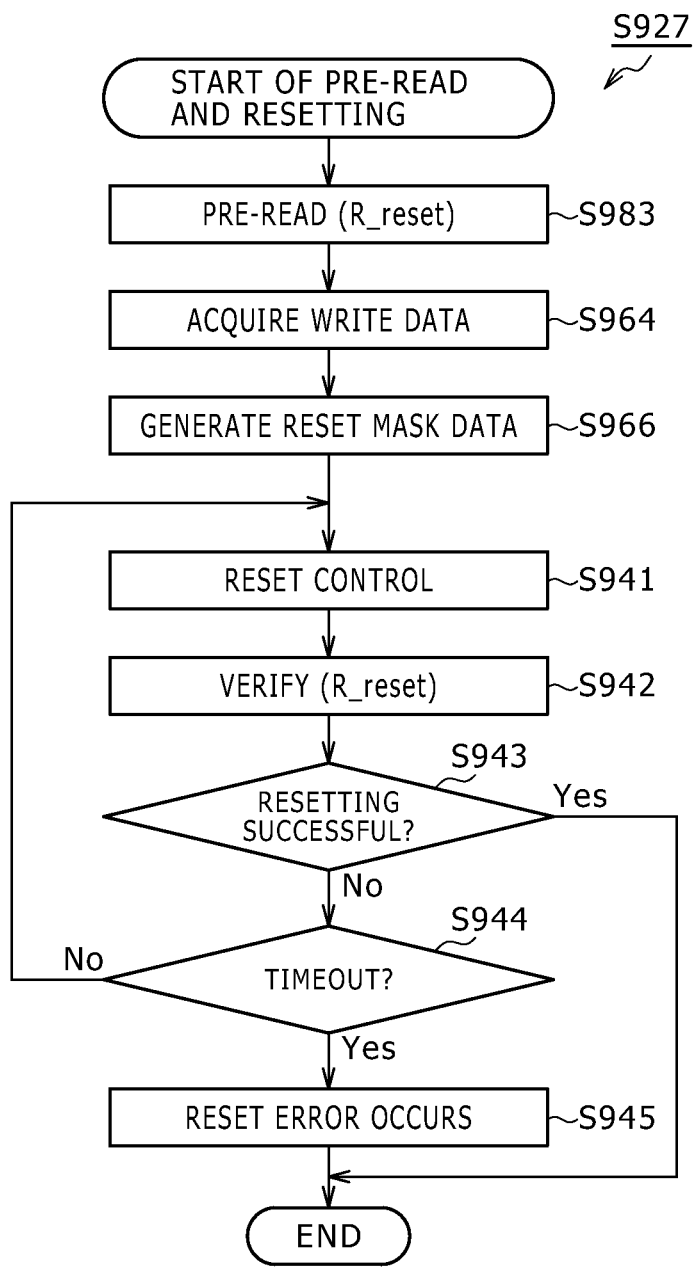

STORAGE CONTROL DEVICE, MEMORY SYSTEM, INFORMATION PROCESSING SYSTEM AND STORAGE CONTROL METHOD

BACKGROUND

The present technology relates to a storage control device, memory system, information processing system and storage control method, and more particularly, to a storage control device, memory system, information processing system and storage control method for controlling a non-volatile memory.

Non-volatile memory (NVM) is occasionally used as an auxiliary storage device or storage in recent information processing systems. This non-volatile memory is broadly classified into a flash memory that can be accessed for large units of data and a non-volatile random access memory (NVRAM) that can be quickly and randomly accessed for small units of data. Here, a typical example of a flash memory is a NAND-type flash memory. On the other hand, ReRAM (Resistance RAM), PCRAM (Phase-Change RAM) and MRAM (Magnetoresistive RAM) are examples of non-volatile random access memories.

Errors may occur due to failure to write data properly during a write to these non-volatile memories. For example, errors often occur in a memory cell whose characteristics have deteriorated due, for example, to deterioration over time or initial defect. In general, a memory cell that has developed an error during a write is regarded as a defective cell and excluded from target cells to be written from the next write and beyond. Therefore, if the number of defective cells increases, the substantial capacity of the non-volatile memory declines. Therefore, a storage device has been proposed which performs a retry process adapted to attempt to write the same data again if a data write is not performed properly (for example, refer to Japanese Patent Laid-Open No. 2004-220068).

SUMMARY

However, it is difficult for the above related art to suppress the increase in number of defective cells. In a non-volatile memory, even if a write adapted to write one of two binary values fails, that adapted to write other of the two binary values may succeed. For example, a non-volatile memory may fail in writing the one of the two binary values if this memory has different criteria for determining whether data has been written properly in two write processes, one adapted to write the one of the two binary values and another adapted to write the other of the two binary values. In the above retry process, however, data of the same value is written. Therefore, even if the write adapted to write a value different therefrom to a memory cell is likely to succeed, the memory cell may be determined to be defective. This makes it difficult to suppress the increase in number of defective cells.

The present technology has been devised in light of the foregoing, and it is desirable to suppress the increase in number of defective cells in a non-volatile memory.

According to a first mode of the present technology, there are provided a storage control device and control method of the same. The storage control device includes first and second rewriting sections and a first retry control section. The first rewriting section performs first rewrite adapted to rewrite the other of the two binary values into a memory cell in which the one of the two binary values is written. The second rewriting section performs second rewrite adapted to rewrite the one of the two binary values into the memory cell in which the other of the two binary values is written. The first retry control section causes the memory cell that has undergone the first rewrite to be subjected to the second rewrite followed by the first rewrite again if an error occurs during the first rewrite. This provides an advantageous effect in that the memory cell that has undergone the first rewrite is subjected to the second rewrite followed by the first rewrite again if an error occurs during the first rewrite.

Alternatively, in the first mode, the storage control device may further include a second retry control section adapted to cause the memory cell that has undergone the second rewrite to be subjected to the first rewrite followed by the second rewrite if an error occurs during the second rewrite. This provides an advantageous effect in that the memory cell that has undergone the second rewrite is subjected to the first rewrite followed by the second rewrite again if an error occurs during the second rewrite.

Still alternatively, in the first mode, the memory cell may be a variable resistance element in which one of two resistance states, demarcated by a given boundary resistance value, is associated with the one of the two values, and the other resistance state is associated with the other of the two values. The first rewriting section may read data from the memory cell with respect to a first resistance value set to the other resistance state by the boundary resistance value and determine that the error has occurred if the data value is not the other of the two values. The second rewriting section may read data from the memory cell with respect to a second resistance value set to the one of the two resistance states by the boundary resistance value and determine that the error has occurred if the data value is not the one of the two values. This provides an advantageous effect in that the first rewriting section determines that the error has occurred if the data read from the memory cell with respect to the first resistance value is not the other of the two values, and that the second rewriting section determines that the error has occurred if the data read from the memory cell with respect to the second resistance value is not the one of the two values.

Still alternatively, in the first mode, the storage control device may further include a defective cell determination section adapted to determine whether the memory cell is defective based on the number of times the errors have been detected in each of the first and second rewriting sections. This provides an advantageous effect in that it is determined whether the memory cell is defective based on the number of times errors have been detected in each of the first and second rewriting sections.

Still alternatively, in the first mode, the first rewriting section may read first data from the memory cell that has undergone the second rewrite with respect to the first resistance value and perform the first rewrite if the first data value is the one of the two values. The second rewriting section may read second data from the memory cell that has undergone the first rewrite with respect to the second resistance value and perform the second rewrite if the second data value is the other of the two values. This provides an advantageous effect in that the first rewrite is performed if the value of the first data read from the memory cell that has undergone the second rewrite with respect to the first resistance value is the one of the two values, and that the second rewrite is performed if the value of the second data read from the memory cell that has undergone the first rewrite with respect to the second resistance value is the other of the two values.

Still alternatively, in the first mode, the first rewriting section may read not only the first data from the memory cell that has undergone the second rewrite with respect to the first resistance value but also third data with respect to the boundary resistance threshold and perform the first rewrite if the first and third data values are different. The second rewriting section may read not only second data from the memory cell that has undergone the first rewrite with respect to the second resistance value but also the third data and perform the second rewrite if the second and third data values are different. This provides an advantageous effect in that the first rewrite is performed if the first and third data values are different, and that the second rewrite is performed if the second and third data values are different.

According to a second mode of the present technology, there is provided a memory system that includes a storage control device and first command issuance section. The storage control device includes first and second rewriting sections and a retry control section. The first rewriting section performs first rewrite adapted to rewrite the other of the two binary values into a memory cell in which the one of the two binary values is written. The second rewriting section performs second rewrite adapted to rewrite the one of the two binary values into the memory cell in which the other of the two binary values is written. The retry control section causes the memory cell that has undergone the first rewrite to be subjected to the second rewrite followed by the first rewrite again in accordance with a given command if an error occurs during the first rewrite. The first command issuance section issues the given command if the first error occurs. This provides an advantageous effect in that the memory cell that has undergone the first rewrite is subjected to the second rewrite followed by the first rewrite again if an error occurs during the first rewrite.

According to a third mode of the present technology, there is provided a memory system that includes a storage control device and first retry control section. The storage control device includes first and second rewriting sections. The first rewriting section performs first rewrite adapted to rewrite the other of the two binary values into a memory cell in which the one of the two binary values is written. The second rewriting section performs second rewrite adapted to rewrite the one of the two binary values into the memory cell in which the other of the two binary values is written. The first retry control section causes the memory cell that has undergone the first rewrite to be subjected to the second rewrite followed by the first rewrite again if an error occurs during the first rewrite. This provides an advantageous effect in that the memory cell that has undergone the first rewrite is subjected to the second rewrite followed by the first rewrite again if an error occurs during the first rewrite.

According to a fourth mode of the present technology, there is provided an information processing system that includes a storage control device and host computer. The storage control device includes first and second rewriting sections and a retry control section. The first rewriting section performs first rewrite adapted to rewrite the other of the two binary values into a memory cell in which the one of the two binary values is written. The second rewriting section performs second rewrite adapted to rewrite the one of the two binary values into the memory cell in which the other of the two binary values is written. The retry control section causes the memory cell that has undergone the first rewrite to be subjected to the second rewrite followed by the first rewrite again in accordance with a given command if an error occurs during the first rewrite. The host computer issues the given command if the first error occurs. This provides an advantageous effect in that the memory cell that has undergone the first rewrite is subjected to the second rewrite followed by the first rewrite again if an error occurs during the first rewrite.

According to a fifth mode of the present technology, there is provided an information processing system that includes a storage control device and host computer. The storage control device includes first and second rewriting sections. The first rewriting section performs first rewrite adapted to rewrite the other of the two binary values into a memory cell in which the one of the two binary values is written. The second rewriting section performs second rewrite adapted to rewrite the one of the two binary values into the memory cell in which the other of the two binary values is written. The host computer causes the memory cell that has undergone the first rewrite to be subjected to the second rewrite followed by the first rewrite again if an error occurs during the first rewrite. This provides an advantageous effect in that the memory cell that has undergone the first rewrite is subjected to the second rewrite followed by the first rewrite again if an error occurs during the first rewrite.

The present technology provides an excellent advantageous effect in that the increase in number of defective cells can be suppressed in a non-volatile memory.

BRIEF DESCRIPTION OF THE DRAWINGS

FIG. 5 is a diagram illustrating an example of status data structure in the first embodiment;

FIG. 6 is a diagram illustrating a configuration example of an address conversion table in the first embodiment;

FIGS. 18A to 18C are diagrams illustrating examples of state transitions of memory cells during retry of resetting in the first embodiment;

FIGS. 23A to 23C are diagrams illustrating examples of state transitions of the memory cells during retry of resetting in the second embodiment;

FIG. 31 is a flowchart illustrating an example of pre-read and resetting in the third embodiment.

DETAILED DESCRIPTION OF THE PREFERRED EMBODIMENTS

A description will be given below of the modes for carrying out the present technology (hereinafter referred to as the embodiments). The description will be given in the following order.

1. First embodiment (example in which refresh is performed first followed by rewrite during retry control)
2. Second embodiment (example in which only the memory cells for which refresh is effective are refreshed and then rewritten)
3. Third embodiment (example in which refresh is performed first followed by rewrite under control of the memory control block)

<1. First Embodiment>
[Configuration Example of the Information Processing System]

Figure 1:
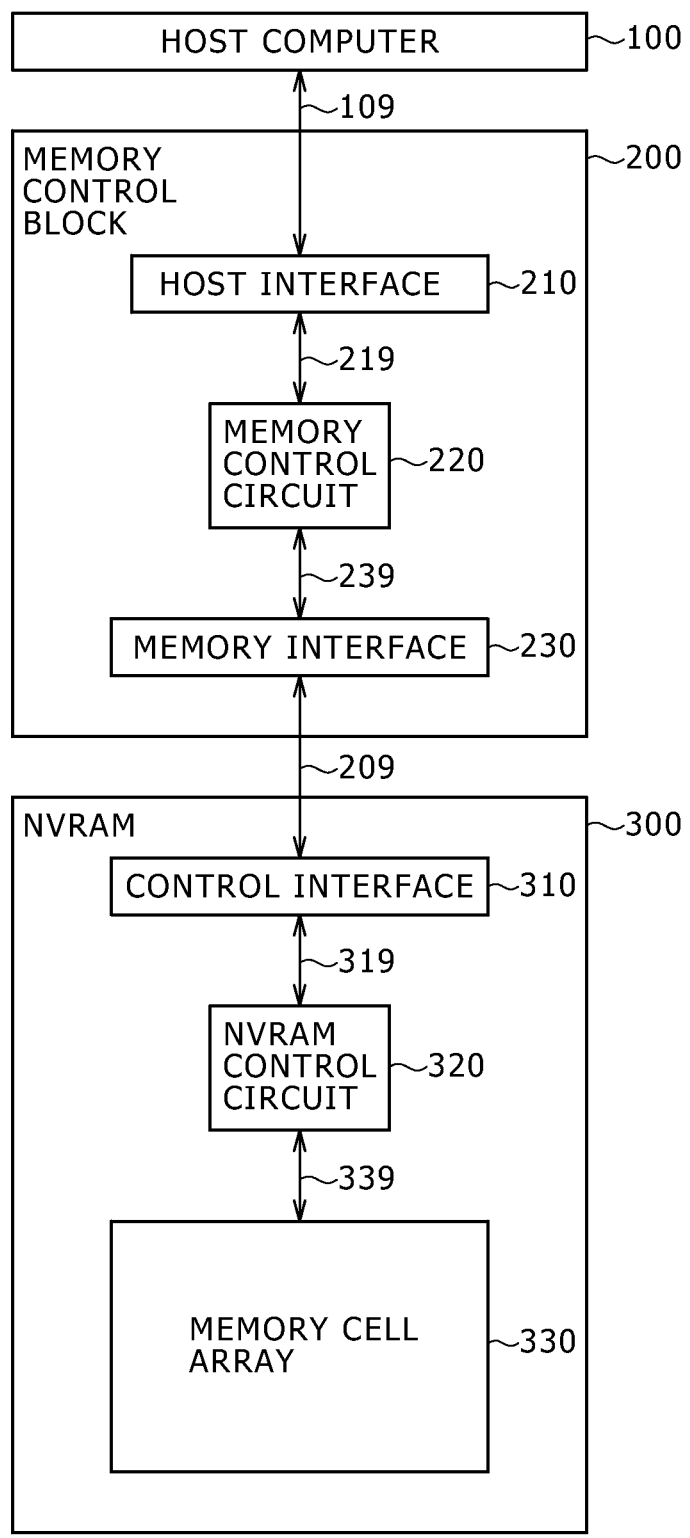
FIG. 1 is a block diagram illustrating a configuration example of an information processing system in a first embodiment.

FIG. 1 is a block diagram illustrating a configuration example of an information processing system in the first embodiment. This information processing system includes a host computer 100 and memory system. This memory system includes a memory control block 200 and an NVRAM 300.

The host computer 100 controls the memory system. More specifically, the same computer 100 issues a command, supplying the command, an address and data to the memory control block 200 via a signal line 109. Further, the host computer 100 receives data and status from the memory system. Here, the command is used to control the memory system and includes, for example, a write command adapted to instruct the writing of data and a read command adapted to instruct the reading of data. The address indicates the storage location of data in the NVRAM 300. More specifically, the address is a logical address in the address space defined by the host computer 100. This logical address is converted to a physical address by the memory system. This physical address is an actual address assigned to a memory cell in the NVRAM 300. The data includes write data to be written to the memory system and read data to be read from the memory system.

The status is information adapted to notify the command execution result or memory system status. The presence or absence of errors and the error types are written as the command execution result in the status. A detailed description will be given later of the error types.

The memory control block 200 controls the NVRAM 300. The same section 200 includes a host interface 210, memory control circuit 220 and memory interface 230. It should be noted that the memory control block 200 is an example of a storage control device as defined in the appended claims.

The host interface 210 exchanges commands, addresses, data and statuses with the host computer 100. An interface such as SATA (Serial Advanced Technology Attachment) or PCI (Peripheral Component Interconnect) Express can be used as the host interface 210.

The memory control circuit 220 controls the memory control block 200 as a whole. When in receipt of a write command, address and write data via the host interface 210, the same circuit 220 supplies them to the memory interface 230. Then, when in receipt of a status for a write command via the memory interface 230, the memory control circuit 220 supplies the status to the host interface 210.

Further, when in receipt of a read command and address via the host interface 210, the memory control circuit 220 supplies them to the memory interface 230. Then, when in receipt of a status and read data via the memory interface 230, the memory control circuit 220 supplies them to the host interface 210.

The memory interface 230 exchanges commands, addresses, data and statuses with the NVRAM 300.

The NVRAM 300 includes a control interface 310, NVRAM control circuit 320 and memory cell array 330.

The control interface 310 exchanges commands, addresses, data and statuses with the memory control block 200.

The NVRAM control circuit 320 controls the NVRAM 300 as a whole. More specifically, when in receipt of a write command, address and write data via the control interface 310, the NVRAM control circuit 320 reads the data written to that address as written data. This read is called pre-read. The NVRAM control circuit 320 compares the write data and written data on a bit-by-bit basis, regarding those bits whose contents in the write data are "1s" and whose contents in the written data are "0s" as the bits to be rewritten. The same circuit 320 rewrites the bits to be rewritten to "1s." This process will be hereinafter referred to as resetting. It should be noted that resetting is also referred to as program processing.

Next, the NVRAM control circuit 320 compares two pieces of data, i.e., the write data and the written data that has undergone setting, on a bit-by-bit basis, regarding those bits whose contents in the write data are "0s" and whose contents in the written data are "1s" as the bits to be rewritten. The same circuit 320 rewrites the bits to be rewritten to "0s." This process will be hereinafter referred to as setting. It should be noted that setting is also referred to as erasure.

Then, the NVRAM control circuit 320 describes the results of resetting and setting in a status. These results include the presence or absence of errors and the error types. Reset error and set error are available as the error types. Reset error is an error that occurs during resetting. Set error is an error that occurs during setting.

Further, when in receipt of a read command and address via the control interface 310, the NVRAM control circuit 320 reads data from the associated address in the memory cell array 330, transferring the data to the memory control block

200. It should be noted that the NVRAM control circuit 320 is an example of a storage control device as defined in the appended claims.

The memory cell array 330 includes a plurality of arranged memory cells. A ReRAM using a variable resistance element, for example, is used as each of the memory cells. It should be noted that non-volatile memories other than ReRAMs may be used in the memory cell array 330 so long as each of these non-volatile memories performs setting and resetting in this order during write.

Figure 2:
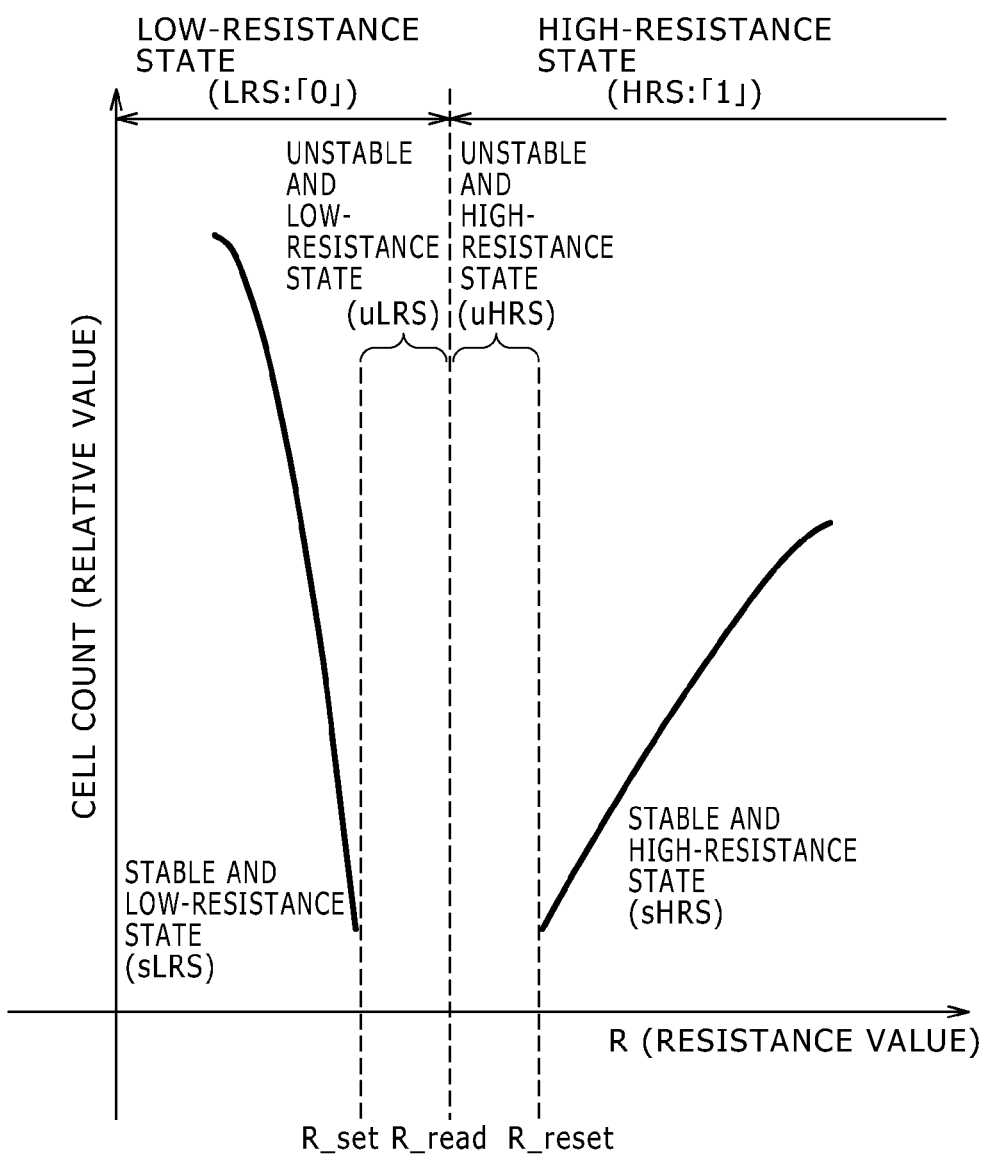
FIG. 2 is a diagram illustrating an example of resistance distribution of a variable resistance element in the first embodiment.

FIG. 2 is a diagram schematically illustrating the resistance distribution of a variable resistance element in the ReRAM. The horizontal axis represents a resistance value R, and the vertical axis the relative distribution of the number of cells by a relative value. As illustrated in FIG. 2, the resistance distribution of the variable resistance element is broadly divided into two types that are referred to as a low-resistance state (LRS) and high-resistance state (HRS). A threshold normally used to separate the low- and high-resistance states will be called the boundary resistance value (R_read).

A variable resistance element serves as a memory cell if one of the logical values 0 and 1 is associated with each of the high- and low-resistance states thereof. It is arbitrary which of the logical values 0 and 1 is associated. For example, the high-resistance state is associated with the logical value 1, and the low-resistance state with the logical value 0.

Here, of the low-resistance state (LRS), that having a relatively high resistance value does not offer excellent data holding characteristic. In the process (e.g., setting) adapted to reduce the resistance value, therefore, a resistance value lower than the boundary resistance value may be used as a threshold. This threshold will be hereinafter referred to as the low-resistance threshold (R_set). On the other hand, the state having a resistance value lower than this low-resistance threshold will be referred to as the stable and low-resistance state (sLRS). The state having a resistance value higher than the low-resistance threshold and lower than the boundary resistance value will be referred to as the unstable and low-resistance state (uLRS).

On the other hand, of the high-resistance state (HRS), that having a relatively low resistance value does not offer excellent data holding characteristic. In the process (e.g., resetting) adapted to increase the resistance value, therefore, a resistance value higher than the boundary resistance value may be used as a threshold. This threshold will be hereinafter referred to as the high-resistance threshold (R_reset). On the other hand, the state having a resistance value higher than this high-resistance threshold will be referred to as the stable and high-resistance state (sHRS). The state having a resistance value lower than the high-resistance threshold and higher than the boundary resistance value will be referred to as the unstable and high-resistance state (uHRS).

Figure 3A:
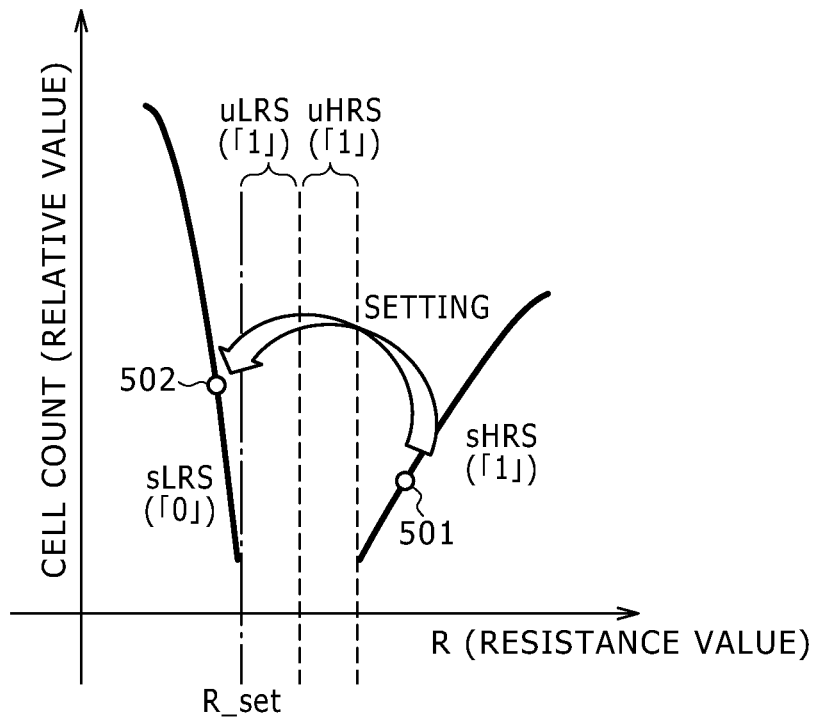
FIGS. 3A and 3B are diagrams illustrating examples of transition of resistance value in the first embodiment.
Figure 3B:
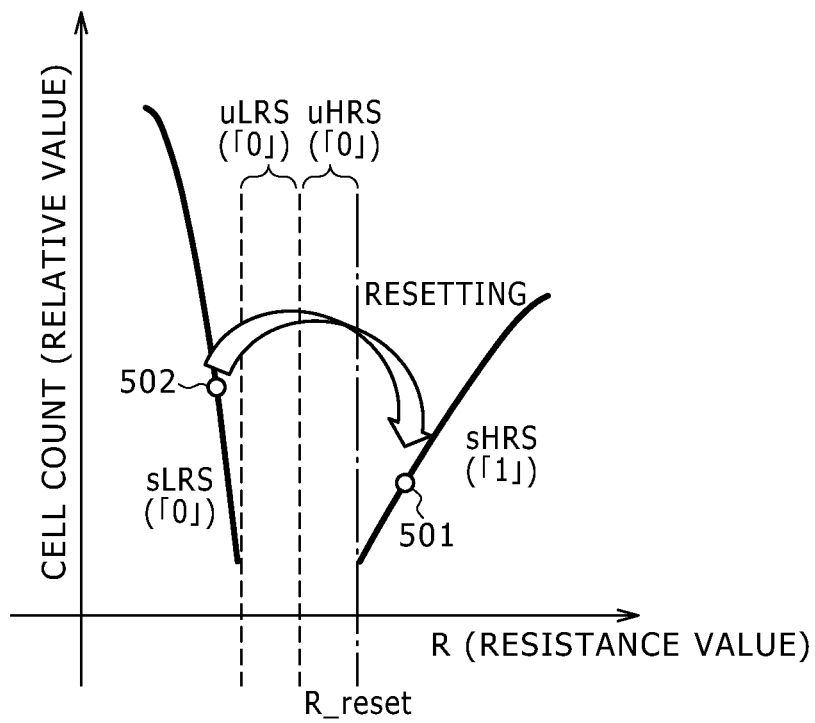

FIGS. 3A and 3B are diagrams illustrating examples of transition of resistance value in the first embodiment.

FIG. 3A is a diagram illustrating an example of transition of resistance value during setting. During setting, control is exercised in such a manner as to reduce the resistance value first, after which data is read from the memory cell with respect to the low-resistance threshold (R_set) so as to verify whether the data has been written (that is, verification). For example, if the resistance value is equal to or smaller than R_set, data with a value of 0 is read. On the other hand, if the resistance value is greater than R_set, data with a value of 1 is read, and it is determined that the write has failed. It is determined that a set error has occurred if a write fails a given number of times or more.

FIG. 3B is a diagram illustrating an example of transition of resistance value during resetting. During resetting, control is exercised in such a manner as to increase the resistance value first, after which data is read from the memory cell with respect to the high-resistance threshold (R_reset) so as to verify whether the data has been written. For example, if the resistance value is equal to or greater than R_reset, data with a value of 1 is read. On the other hand, if the resistance value is smaller than R_reset, data with a value of 0 is read, and it is determined that the write has failed. It is determined that a reset error has occurred if a write fails a given number of times or more.

[Configuration Example of the Memory Control Circuit]

Figure 4:
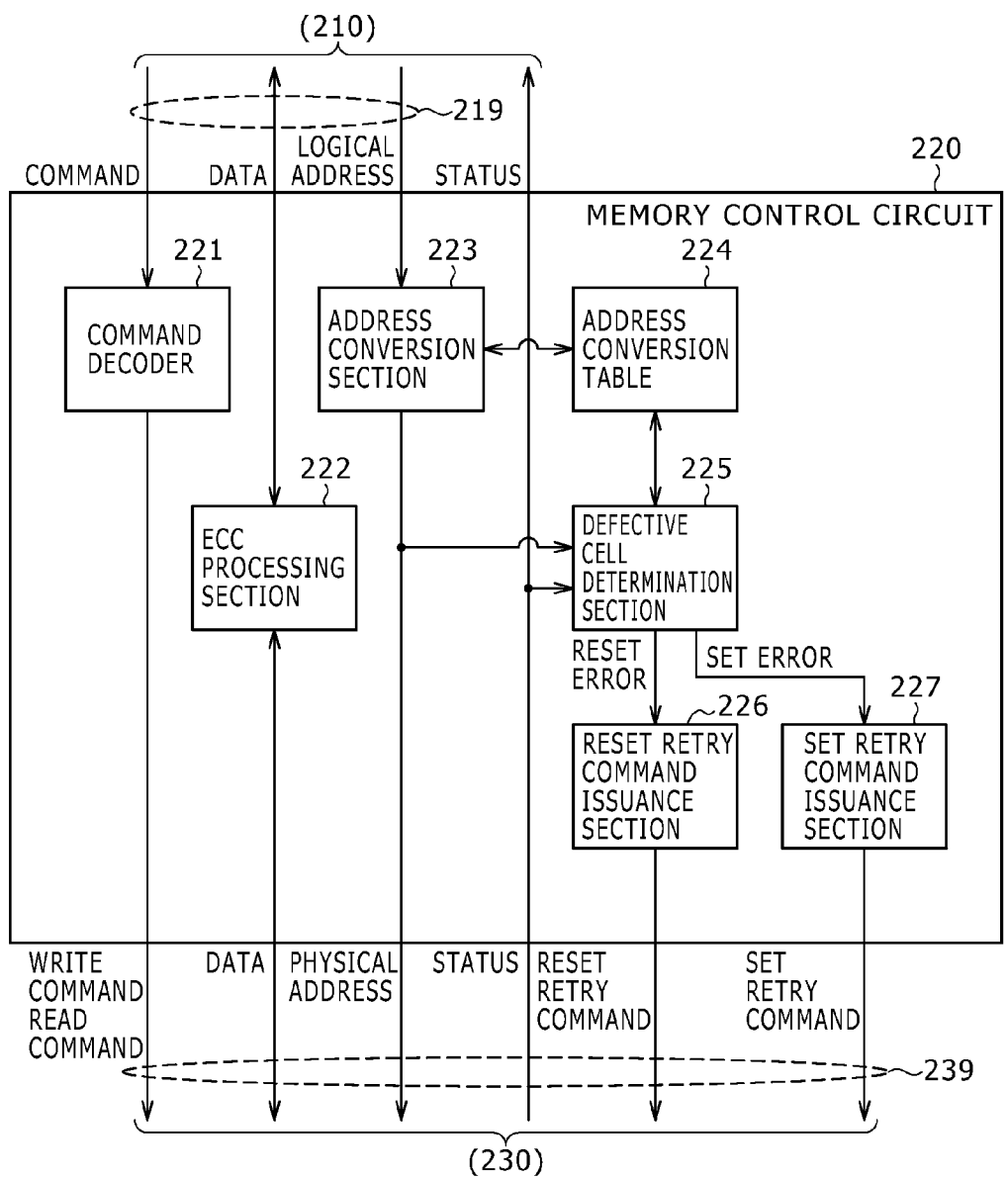
FIG. 4 is a block diagram illustrating a configuration example of a memory control circuit in the first embodiment.

FIG. 4 is a block diagram illustrating a configuration example of the memory control circuit 220 in the first embodiment. The same circuit 220 includes a command decoder 221, ECC processing section 222, address conversion section 223, address conversion table 224, defective cell determination section 225, reset retry command issuance section 226 and set retry command issuance section 227.

The command decoder 221 decodes a command received from the host computer 100 via the host interface 210. The same decoder 221 supplies the decoded command (write or read command) to the NVRAM 300 via the memory interface 230.

The ECC processing section 222 generates an error correcting code (ECC) for write data and detects and corrects errors in the read data based on the ECC. When in receipt of write data via the host interface 210, the ECC processing section 222 generates an ECC for the write data, supplying the ECC together with the write data to the NVRAM 300 via the memory interface 230. On the other hand, when in receipt of read data and ECC for the read data from the NVRAM 300 via the memory interface 230, the ECC processing section 222 detects and corrects errors in the read data based on the ECC. Then, the same section 222 supplies the read data subjected to error detection and correction to the host computer 100 via the host interface 210.

The address conversion section 223 converts a logical address into a physical address. When in receipt of a logical address via the host interface 210, the same section 223 reads the physical address associated with the logical address from the address conversion table 224. If there is no associated physical address, the same section 223 associates one of the non-defective physical addresses in the address conversion table 224 with the physical address. The address conversion section 223 supplies the converted physical address to the defective cell determination section 225 and NVRAM 300.

The address conversion table 224 contains physical addresses and logical addresses that are associated with each other. Further, the same table 224 describes whether each of the physical address is defective. Here, the term "defective physical address" refers to a physical address corresponding to a defective cell which is a memory cell having a deteriorated data holding characteristic.

The defective cell determination section 225 determines, based on the set error or reset error count, whether a memory cell that has developed these errors is defective. When in receipt of a status including set or reset errors from the NVRAM 300, the same section 225 determines, based on the set or reset errors, whether the memory cell to be written is defective. For example, the defective cell determination section 225 determines that the memory cell to be written is defective if it develops two or more set or reset errors during a write. If the memory cell is determined to be defective, the defective cell determination section 225 describes in the address conversion table 224 that the physical address to be written is defective.

On the other hand, if the memory cell is determined not to be defective, the defective cell determination section 225 notifies the reset retry command issuance section 226 or set retry command issuance section 227 of the error based on the error type. More specifically, if the error is a reset error, the defective cell determination section 225 notifies the reset retry command issuance section 226 that a reset error has occurred. On the other hand, if the error is a set error, the defective cell determination section 225 notifies the set retry command issuance section 227 that a set error has occurred.

The reset retry command issuance section 226 issues a reset retry command if a reset error occurs. The reset retry command instructs that the memory cells that have undergone resetting be subjected to setting first followed by resetting again. The reset retry command issuance section 226 supplies the issued reset retry command to the NVRAM 300 via the memory interface 230.

The set retry command issuance section 227 issues a set retry command if a set error occurs. The set retry command instructs that the memory cells that have undergone setting be subjected to resetting first followed by setting again. The set retry command issuance section 227 supplies the issued set retry command to the NVRAM 300 via the memory interface 230. It should be noted that the reset retry command issuance section 226 is an example of a first command issuance section as defined in the appended claims.

It should be noted that although the write command, reset retry command and set retry command are shown to be transferred via different signal lines in FIG. 4 for the convenience of description, these commands are actually transferred via the same signal line. On the other hand, although provided in the memory control block 200, the reset retry command issuance section 226 and set retry command issuance section 227 may be provided in the host computer 100.

FIG. 5 is a diagram illustrating an example of status data structure in the first embodiment. The status includes, for example, 7-bit data. The 0th bit of the status indicates whether an error has occurred. For example, if a write or read is normally terminated, "0" is set in the 0th bit. If an error occurs, "1" is set in this bit. The 1st bit of the status indicates the type of error that has occurred in the write. For example, if a set error occurs, "0" is set in the 1st bit. If a reset error occurs, "1" is set in this bit.

Further, the 6th bit of the status indicates whether the NVRAM 300 is busy. For example, if the NVRAM 300 is busy, "0" is set in the 6th bit. If the NVRAM 300 is ready, "1" is set in this bit. The 7th bit of the status indicates whether the NVRAM 300 is protected. Here, the term "protected" refers to the fact that the writing of write data to the NVRAM 300 is prohibited. For example, if the NVRAM 300 is protected, "0" is set in the 7th bit. If the NVRAM 300 is not protected, "1" is set in this bit.

It should be noted that if information is included to indicate whether the error is a set or reset error, the status data structure is not limited to that shown in FIG. 5.

FIG. 6 is a diagram illustrating a configuration example of the address conversion table 224 in the first embodiment. The same table 224 contains logical addresses and physical addresses that are associated with each other. Further, the same table 224 includes information as to whether each of the physical addresses is defective. For example, if a physical address is not defective, a value of "0" is included for that physical address. If the physical address is defective, a value of "1" is included for that physical address. It should be noted that a table adapted to associate each of the physical addresses with information indicating whether the physical address is defective may be provided separately from the table associating logical addresses with physical addresses.

Figure 7:
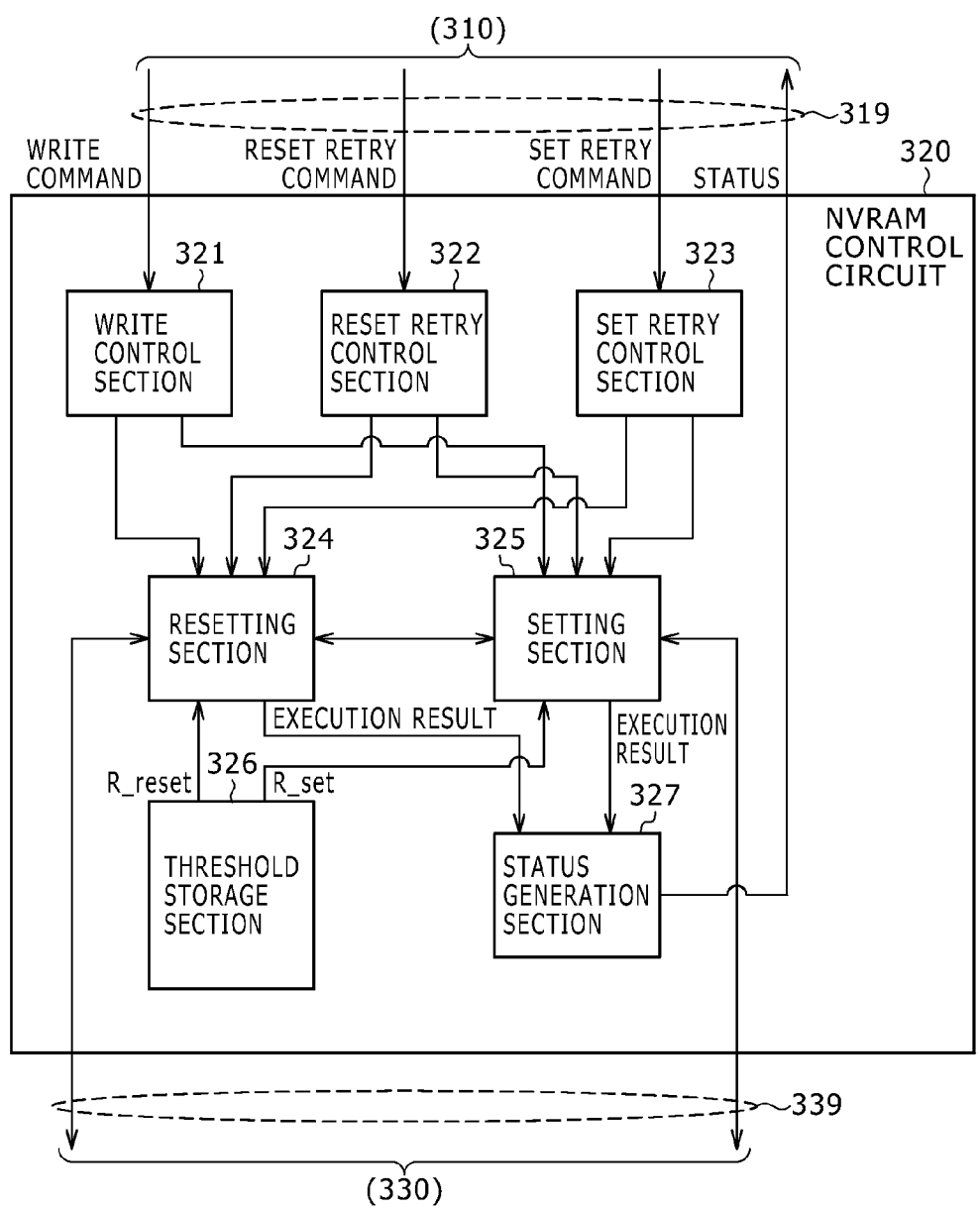
FIG. 7 is a block diagram illustrating a configuration example of an NVRAM control circuit in the first embodiment.

FIG. 7 is a block diagram illustrating a configuration example of the NVRAM control circuit 320 in the first embodiment. The same circuit 320 includes a write control section 321, reset retry control section 322, set retry control section 323, resetting section 324, setting section 325, threshold storage section 326 and status generation section 327.

The write control section 321 performs resetting and setting in this order according to a write command. When in receipt of a write command via the control interface 310, the same section 321 controls the resetting section 324 to perform resetting according to the command. In this control, the write control section 321 issues a reset command to instruct that resetting be performed, supplying the reset command to the resetting section 324. Then, the write control section 321 controls the setting section 325 to perform setting. In this control, the write control section 321 issues a set command to instruct that setting be performed, supplying the set command to the setting section 325.

It should be noted that the write control section 321 causes resetting to be performed prior to setting. However, setting may be performed prior to resetting. If either the probability of occurrence of set errors or that of reset errors is known to be higher than the other, the write control section 321 may determine the order in which to perform the resetting and setting based on the probabilities of occurrences of set and reset errors. More specifically, the same section 321 performs resetting first if the probability of occurrence of reset errors is higher than that of set errors. The same section 321 performs setting first if the probability of occurrence of set errors is higher than that of reset errors. Performing the process suitable for the type of error more likely to occur first ensures a shorter time from the occurrence of an error to the start of a retry.

The reset retry control section 322 causes setting and resetting to be performed in this order according to a reset retry command. When in receipt of a reset retry command via the control interface 310, the same section 322 controls the setting section 325 to perform setting of the memory cells that have undergone resetting using the set command. Then, the reset retry control section 322 causes the resetting section 324 to reset the memory cell again using the reset command. It should be noted that the reset retry control section 322 is an example of a first retry control section as defined in the appended claims.

The set retry control section 323 causes resetting and setting to be performed in this order according to a set retry command. When in receipt of a set retry command via the control interface 310, the same section 323 causes the resetting section 324 to perform resetting of the memory cells that has undergone setting using the reset command. Then, the set retry control section 323 controls the setting section 325 to set the memory cells again using the set command. It should be noted that the set retry control section 323 is an example of a second retry control section as defined in the appended claims.

The resetting section 324 performs resetting under control of the write control section 321, reset retry control section 322 or set retry control section 323. The same section 324 acquires the high-resistance threshold R_reset from the threshold storage section 326, performing pre-read with respect to the threshold and resetting the memory cells based on the pre-read data. Then, the resetting section 324 reads the data from the reset memory cells with respect to the high-resistance threshold R_reset, performing verification. The resetting section 324 determines that a reset error has occurred if, as a result of the verification, any of the memory cells to be reset is not reset. The same section 324 notifies the execution result including the presence or absence of error to the status generation section 327. It should be noted that the resetting section 324 is an example of a first rewriting section as defined in the appended claims.

The setting section 325 performs setting under control of the write control section 321, reset retry control section 322 or set retry control section 323. The same section 325 acquires the low-resistance threshold R_set from the threshold storage section 326, performing pre-read with respect to the threshold and setting the memory cells based on the pre-read data. Then, the setting section 325 reads the data from the set memory cells with respect to the low-resistance threshold R_set, performing verification. The same section 325 determines that a set error has occurred if, as a result of the verification, any of the memory cells to be set is not set. The same section 325 notifies the execution result including the presence or absence of error to the status generation section 327. It should be noted that the setting section 325 is an example of a second rewriting section as defined in the appended claims.

The threshold storage section 326 stores the low-resistance threshold R_set and high-resistance threshold R_reset.

The status generation section 327 generates a status based on the execution results of the resetting section 324 and setting section 325. The same section 327 generates a status including a normal termination if no error is detected by the resetting section 324 or setting section 325. On the other hand, the status generation section 327 generates a status including a reset error if an error is detected by the resetting section 324. The same section 327 generates a status including a set error if an error is detected by the setting section 325. The status generation section 327 supplies the generated status to the memory control block 200 via the control interface 310.

Further, when in receipt of a read command, the NVRAM control circuit 320 performs a read according to the read command. The circuits and other sections performing a read are not shown in FIG. 7.

[Operation Example of the Memory Control Block]

Figure 8:
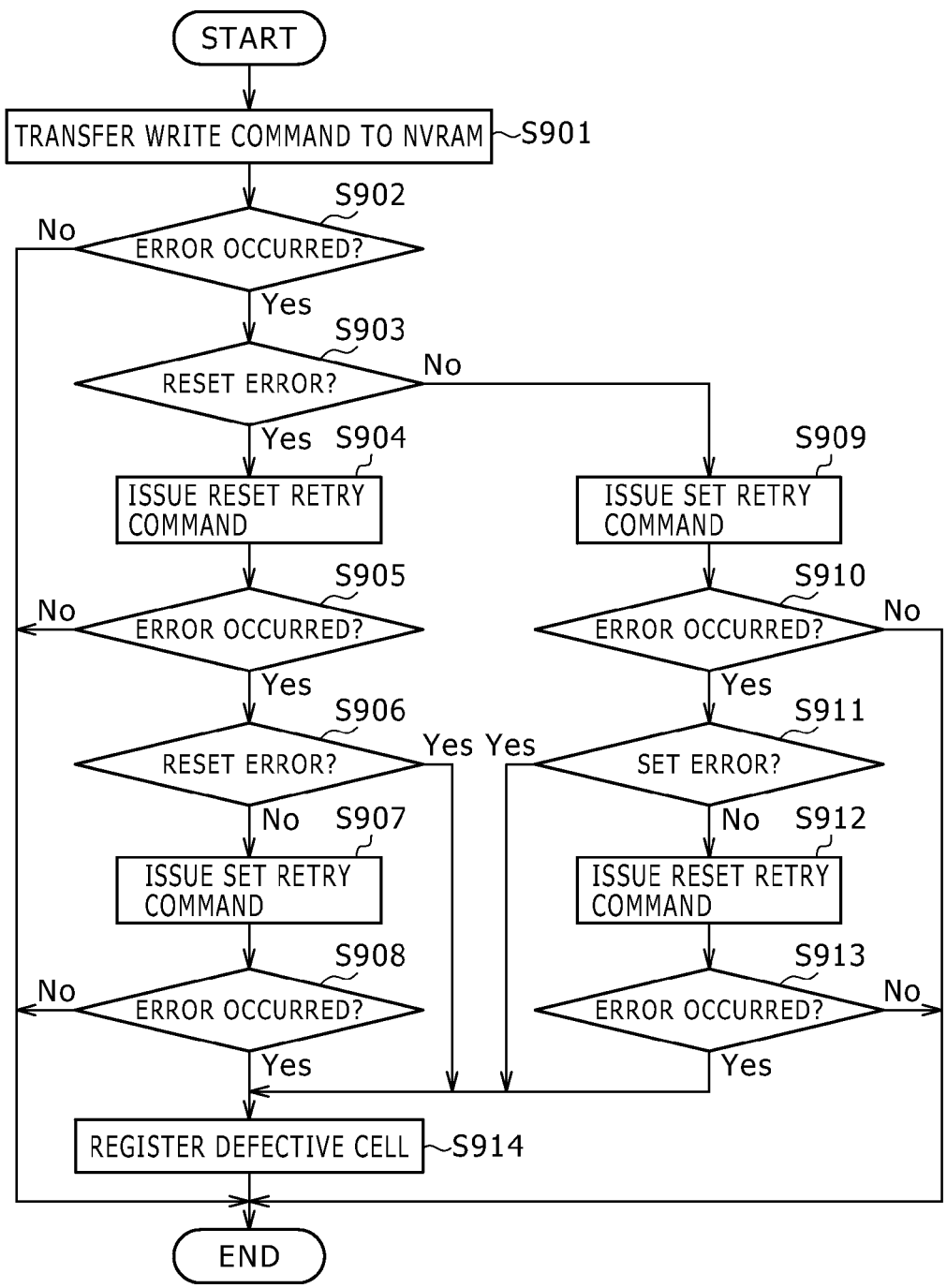
FIG. 8 is a flowchart illustrating an operation example of a memory control block in the first embodiment.

FIG. 8 is a flowchart illustrating an operation example of the memory control block 200 in the first embodiment. This operation begins, for example, when the memory control block 200 receives a write command from the host computer 100. It should be noted that the operation of the memory control block 200 when in receipt of a read command is not shown in FIG. 8.

The command decoder 221 in the memory control block 200 decodes a write command, transferring the decoded command to the NVRAM 300 (step S901). The defective cell determination section 225 in the memory control block 200 receives a status from the NVRAM 300, determining, based on the status, whether an error has occurred during resetting or setting (step S902). If an error has occurred (Yes in step S902), the same section 225 determines first whether the first error is a reset error (step S903).

If the first error is a reset error (Yes in step S903), the reset retry command issuance section 226 in the memory control block 200 issues a reset retry command (step S904). Then, the defective cell determination section 225 receives a status from the NVRAM 300 again, determining whether an error has occurred during resetting or setting (step S905). The same section 225 determines whether the second error is a reset error (step S906).

If the second error is not a reset error (No in step S906), the set retry command issuance section 227 in the memory control block 200 issues a set retry command (step S907). Then, the defective cell determination section 225 receives a status from the NVRAM 300 again, determining whether an error has occurred during resetting or setting (step S908). If a third error has occurred (Yes in step S908) or if the second error is a reset error (Yes in step S906), the defective cell determination section 225 determines that the memory cell to be written is defective. The same section 225 registers the physical address associated with the defective cell in the address conversion table 224 (step S914) as a defective address.

If the first error is not a reset error (No in step S903), the set retry command issuance section 227 issues a set retry command (step S909). Then, the defective cell determination section 225 receives a status from the NVRAM 300 again, determining whether an error has occurred during resetting or setting (step S910). If an error has occurred (Yes in step S910), the defective cell determination section 225 determines whether the second error is a set error (step S911).

If the second error is not a set error (No in step S911), the reset retry command issuance section 226 issues a reset retry command (step S912). Then, the defective cell determination section 225 receives a status from the NVRAM 300 again, determining whether an error has occurred during resetting or setting (step S913). If the third error has occurred (Yes in step S913) or if the second error is a set error (Yes in step S911), the defective cell determination section 225 determines that the memory cell to be written is defective (step S914).

If no error has occurred in step S902, S905, S908, S910 or S913 or after step 914 is performed, the memory control block 200 stops its operation.

[Operation Example of the NVRAM]

Figure 9:
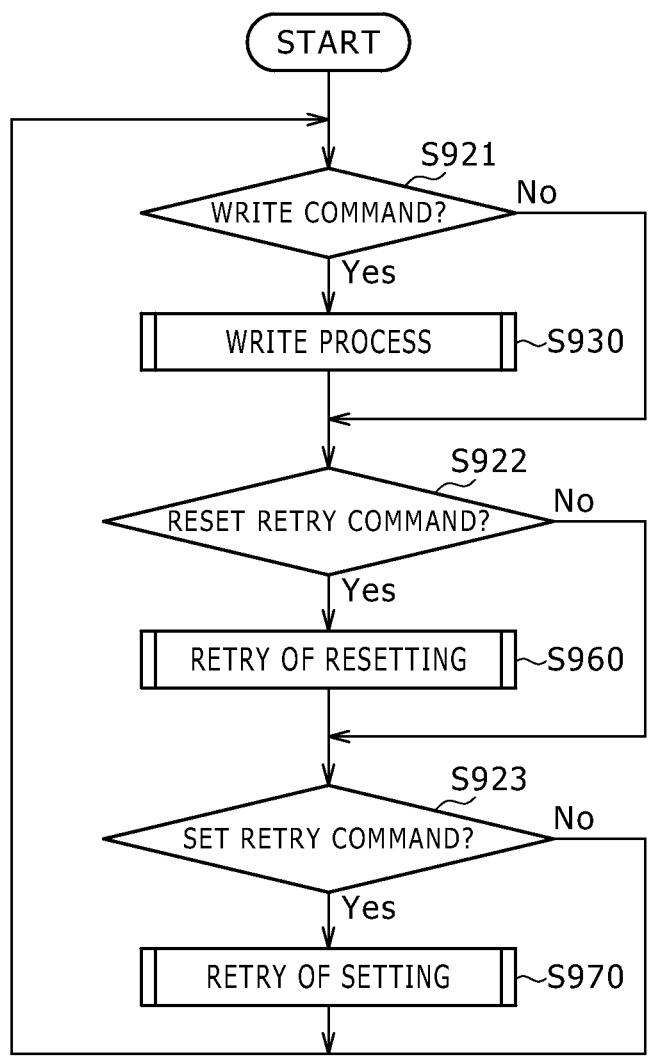
FIG. 9 is a flowchart illustrating an operation example of an NVRAM in the first embodiment.

FIG. 9 is a flowchart illustrating an operation example of the NVRAM 300. This operation begins, for example, when the NVRAM 300 is powered on. It should be noted that the operation of the NVRAM 300 when in receipt of a read command is not shown in FIG. 9.

The NVRAM 300 determines whether a write command has been received from the memory control block 200 (step S921). If a write command has been received (Yes in step S921), the write control section 321 in the NVRAM 300 performs a write to write the write data to the memory cell (step S930).

If a write command has not been received (No in step S921) or after step S930 is performed, the NVRAM 300 determines whether a reset retry command has been received from the memory control block 200 (step S922). If a reset retry command has been received (Yes in step S922), the reset retry control section 322 in the NVRAM 300 retries resetting to perform resetting again (S960).

If a reset retry command has not been received (No in step S922) or after step S960 is performed, the NVRAM 300 determines whether a set retry command has been received from the memory control block 200 (step S923). If a set retry command has been received (Yes in step S923), the set retry control section 323 in the NVRAM 300 retries setting to perform setting again (S970). If a set retry command has not been received (No in step S923) or after step S970 is performed, the NVRAM 300 returns to step S921.

Figure 10:
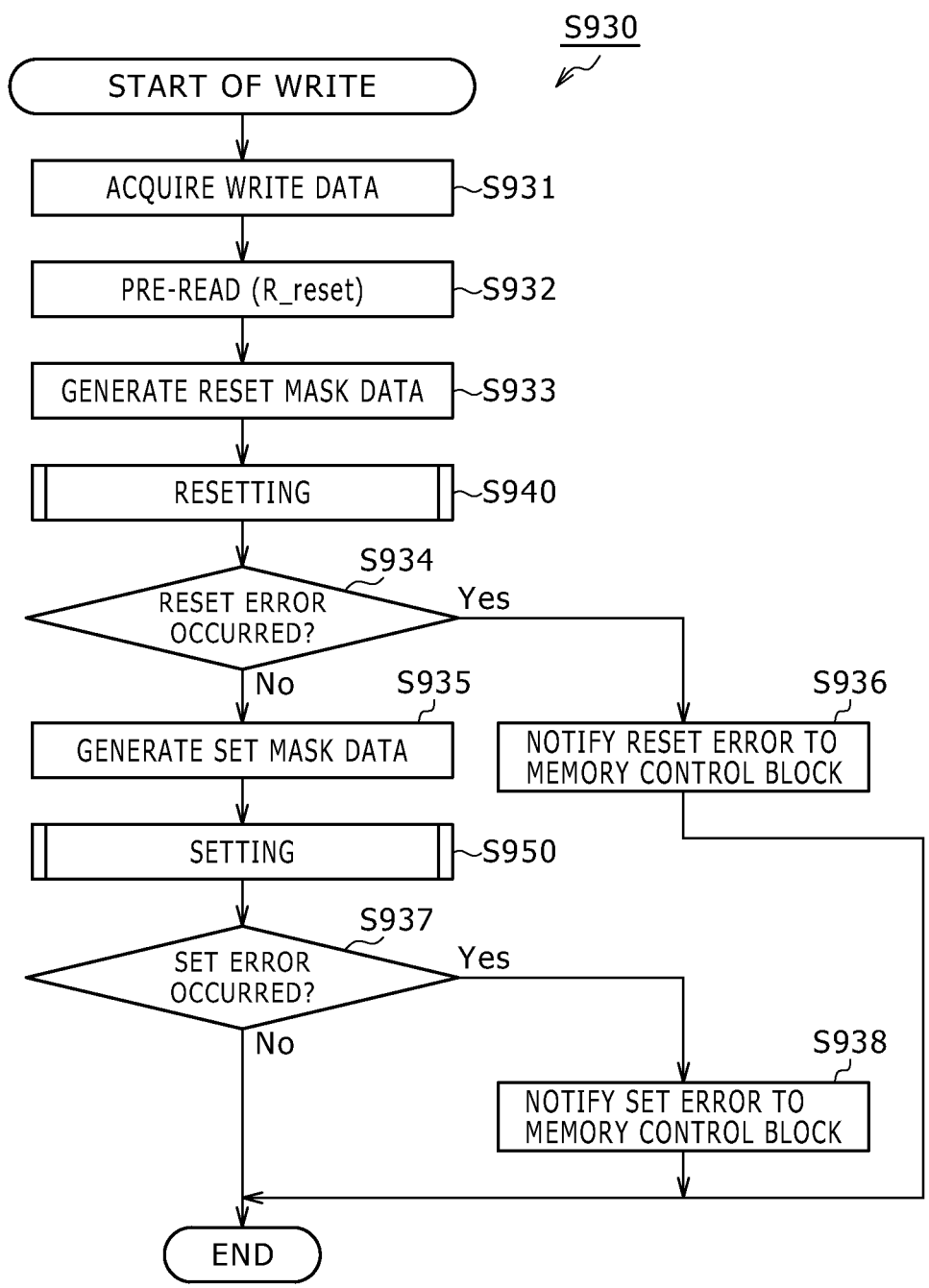
FIG. 10 is a flowchart illustrating an example of write in the first embodiment.

FIG. 10 is a flowchart illustrating an example of write in the first embodiment. The write control section 321 instructs the resetting section 324 to perform resetting. The resetting section 324 acquires and holds write data first (step S931). Further, the same section 324 pre-reads the address to be written with respect to the high-resistance threshold R_reset (step S932). The same section 324 compares the corresponding bits of the pre-read data that has been pre-read and the write data, generating reset mask data (step S933). This reset mask data indicates that those bits that are reset in the write data and that are set in the pre-read data will be reset and that all other bits will be masked. The resetting section 324 performs resetting based on the reset mask data (step S940).

The write control section 321 determines whether a reset error has occurred (step S934). If a reset error has not occurred (No in step S934), the same section 321 instructs the setting section 325 to perform setting. The setting section 325 compares the corresponding bits of the pre-read data and write data after the resetting, generating set mask data (step S935). This set mask data indicates that those bits that are set in the write data and that are reset in the pre-read data after the resetting will be set and that all other bits will be masked. The setting section 325 performs setting based on the set mask data (step S950).

The status generation section 327 determines whether a set error has occurred (step S937). If a set error has occurred (Yes in step S937), the same section 327 generates a status including the occurrence of a set error, transferring the status to the memory control block 200 (step S938). On the other hand, if a reset error has occurred (Yes in step S934), the status generation section 327 generates a status including the occurrence of a reset error, transferring the status to the memory control block 200 (step S936). If a set error has not occurred (No in Step S937) or after step S936 or S938 is performed, the write control section 321 terminates the write.

Figure 11:
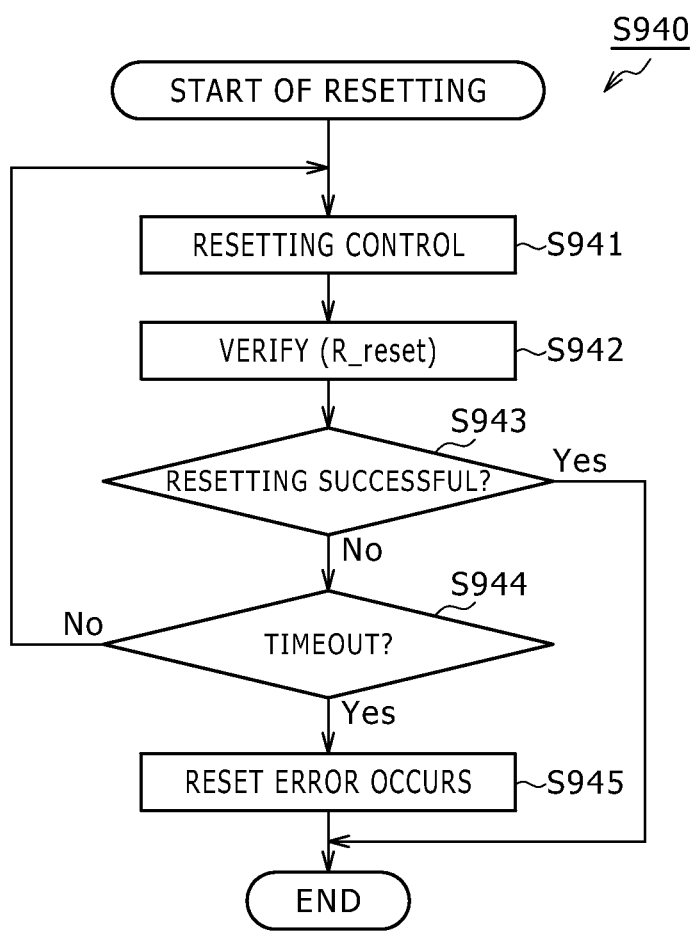
FIG. 11 is a flowchart illustrating an example of resetting in the first embodiment.

FIG. 11 is a flowchart illustrating an example of resetting in the first embodiment. The resetting section 324 performs a process (resetting control) adapted to rewrite, from "0s" to "1s," only those bits which have been instructed to be reset by the reset mask data (step S941). Then, the resetting section 324 reads the data from the reset memory cells with respect to the high-resistance threshold R_reset, verifying whether all the memory cells to be reset have been done so (that is, verification) (step S942).

The resetting section 324 determines whether all the memory cells to be reset have been done so (that is, whether the resetting has succeeded) (step S943). If the resetting has failed (No in step S943), the resetting section 324 determines whether a timeout has occurred (step S944). Here, the term "timeout" refers to the fact that resetting or setting fails a given number of times or more.

If a timeout has not occurred (No in step S944), the resetting section 324 returns to step S941. If a timeout has occurred (Yes in step S944), the same section 324 determines that a reset error has occurred (step S945). If the resetting has succeeded (Yes in step S943) or after step S945 is performed, the resetting section 324 terminates the resetting.

Figure 12:
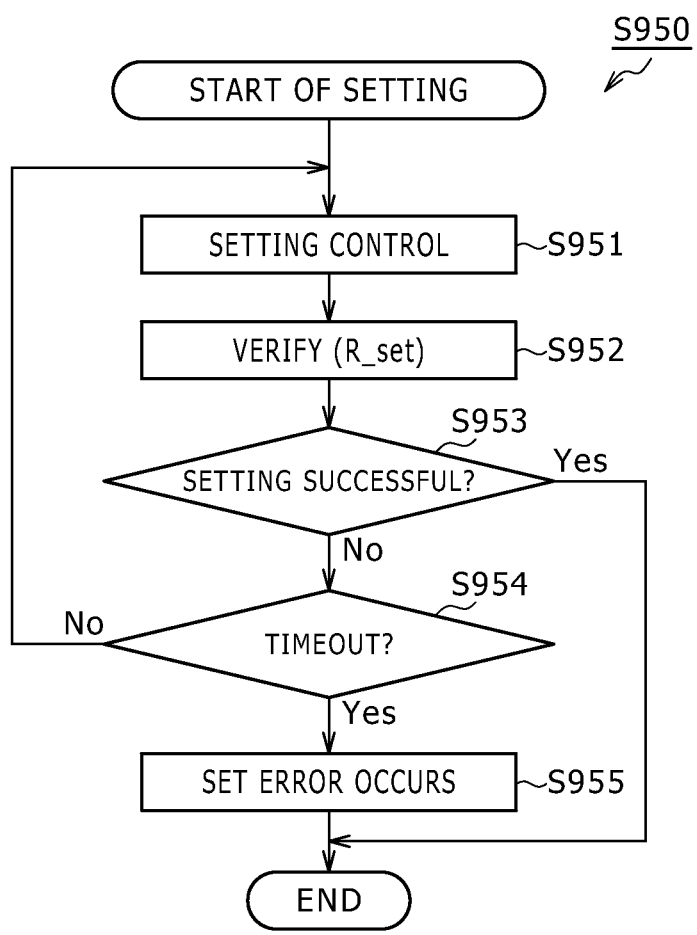
FIG. 12 is a flowchart illustrating an example of setting in the first embodiment.

FIG. 12 is a flowchart illustrating an example of setting in the first embodiment. The setting section 325 performs a process (setting control) adapted to rewrite, from "1s" to "0s," only those bits which have been instructed to be set by the set mask data (step S951). Then, the setting section 325 reads the data from the set memory cells with respect to the low-resistance threshold R_set, verifying whether all the memory cells to be set have been done so (that is, verification) (step S952).

The setting section 325 determines whether all the memory cells to be set have been done so (that is, whether the setting has succeeded) (step S953). If the setting has failed (No in step S953), the setting section 325 determines whether a timeout has occurred (step S954).

If a timeout has not occurred (No in step S954), the setting section 325 returns to step S951. If a timeout has occurred (Yes in step S954), the same section 325 determines that a set error has occurred (step S955). If the setting has succeeded (Yes in step S953) or after step S955 is performed, the setting section 325 terminates the setting.

Figure 13:
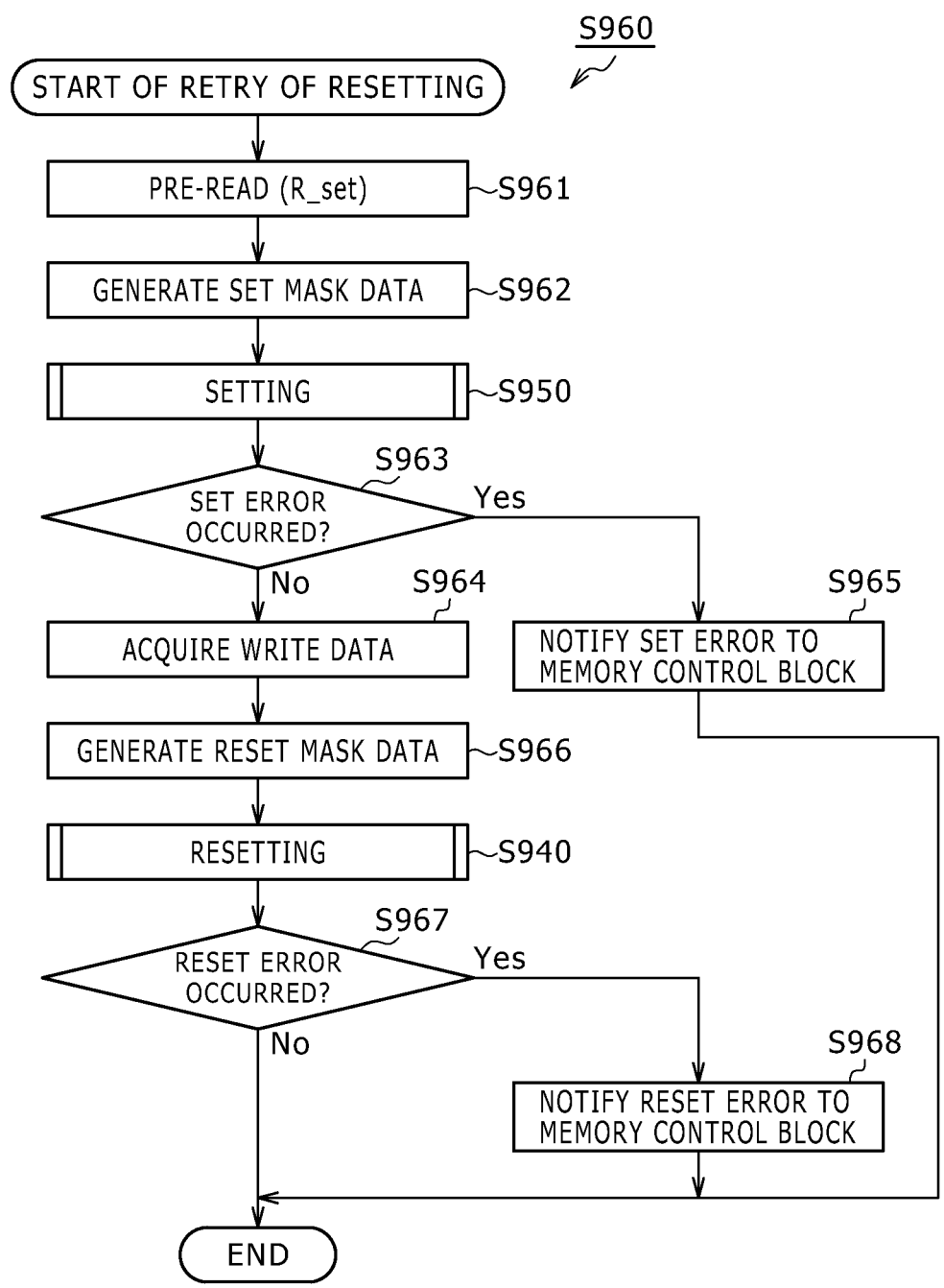
FIG. 13 is a flowchart illustrating an example of retry of resetting in the first embodiment.

FIG. 13 is a flowchart illustrating an example of retry of resetting in the first embodiment. The reset retry control section 322 instructs the setting section 325 to perform setting using a set command. A memory cell in which resetting has failed provides improved data holding capability if it is set once, thus offering higher probability of successful second resetting. Hereinafter, the setting performed for improved data holding capability during a retry of resetting will be referred to as the refresh setting. The setting section 325 pre-reads the reset memory cell with respect to the low-resistance threshold R_set (step S961). The setting section 325 generates set mask data to set only the reset bits of all the pre-read bits to be reset (step S962). The same section 325 performs setting (refresh setting) based on the set mask data (step S950).

The reset retry control section 322 determines whether a set error has occurred (step S963). If a set error has not occurred (No in step S963), the same section 322 instructs the resetting section 324 to perform resetting again using a reset command. The resetting section 324 acquires write data (step S964). The same section 324 generates reset mask data from the set data and write data (step S966). The resetting section 324 performs resetting based on the reset mask data (step S940).

The status generation section 327 determines whether a reset error has occurred (step S967). If a reset error has occurred (Yes in step S967), the same section 327 generates a status including the occurrence of a reset error, transferring the status to the memory control block 200 (step S968). On the other hand, if a set error has occurred (Yes in step S963), the status generation section 327 generates a status including the occurrence of a set error, transferring the status to the memory control block 200 (step S965). If a reset error has not occurred (No in Step S967) or after step S965 or S968 is performed, the reset retry control section 322 terminates the retry of resetting.

Figure 14:
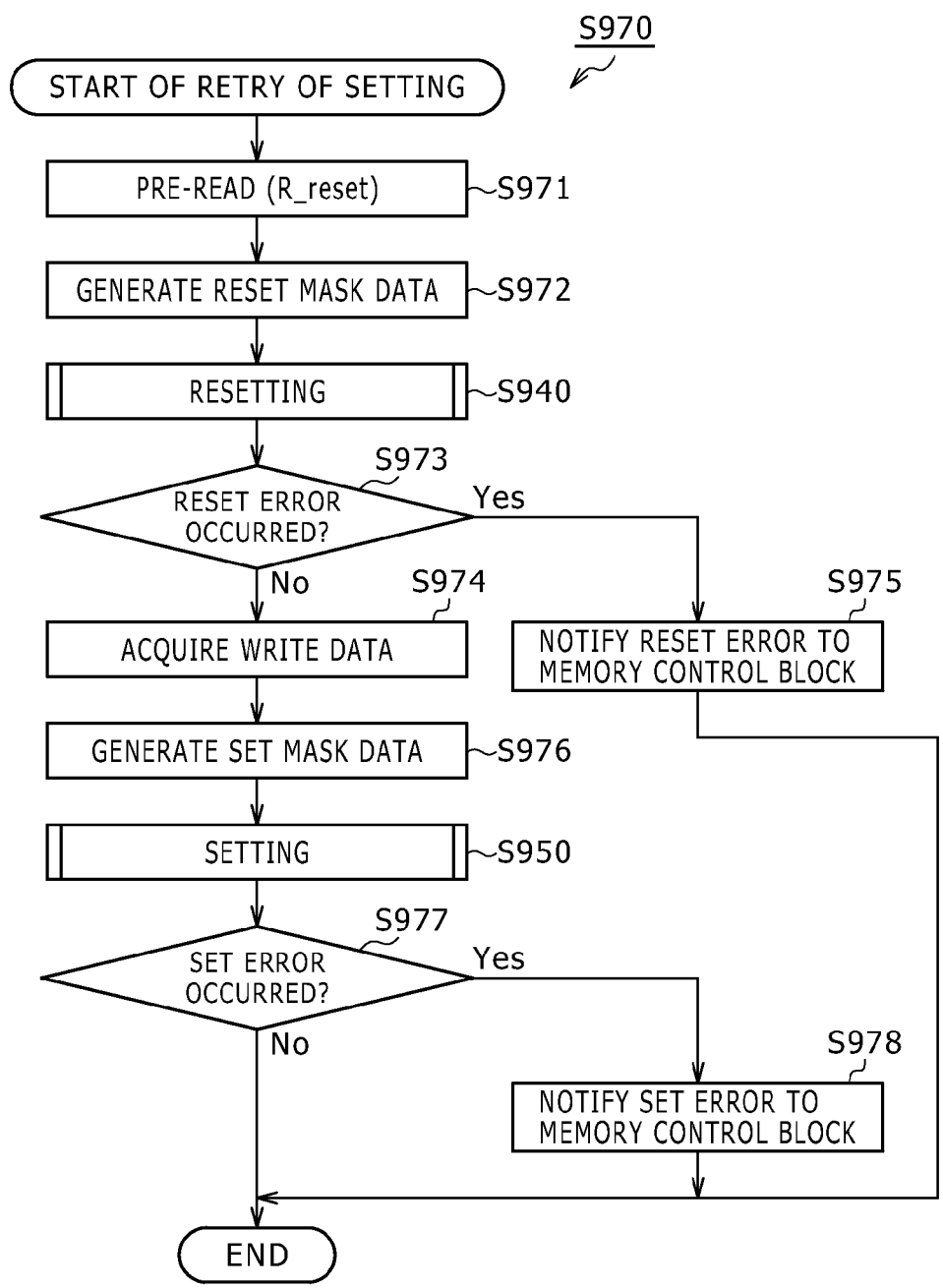
FIG. 14 is a flowchart illustrating an example of retry of setting in the first embodiment.

FIG. 14 is a flowchart illustrating an example of retry of setting in the first embodiment. The set retry control section 323 instructs the resetting section 324 to perform resetting using a reset command. A memory cell in which setting has failed provides improved data holding capability if it is reset once, thus offering higher probability of successful second setting. Hereinafter, the resetting performed for improved data holding capability during a retry of setting will be referred to as the refresh resetting. Further, the refresh resetting and refresh setting will be referred to as the refresh. The resetting section 324 pre-reads the set memory cell with respect to the high-resistance threshold R_reset (step S971). The same section 324 generates reset mask data to reset only the set bits of all the pre-read bits to be set (step S972). The same section 324 performs resetting (refresh resetting) based on the reset mask data (step S940).

The set retry control section 323 determines whether a reset error has occurred (step S973). If a reset error has not occurred (No in step S973), the same section 323 instructs the setting section 325 to perform setting again using a set command. The setting section 325 acquires write data (step S974). The same section 325 generates set mask data from the reset data and write data (step S976). The setting section 325 performs setting based on the set mask data (step S950).

The status generation section 327 determines whether a set error has occurred (step S977). If a set error has occurred (Yes in step S977), the same section 327 generates a status including the occurrence of a set error, transferring the status to the memory control block 200 (step S978). On the other hand, if a reset error has occurred (Yes in Step S973), the status generation section 327 generates a status including the occurrence of a reset error, transferring the status to the memory control block 200 (step S975). If a set error has not occurred (No in Step S977) or after step S975 or S978 is performed, the set retry control section 323 terminates the retry of setting.

Figure 15:
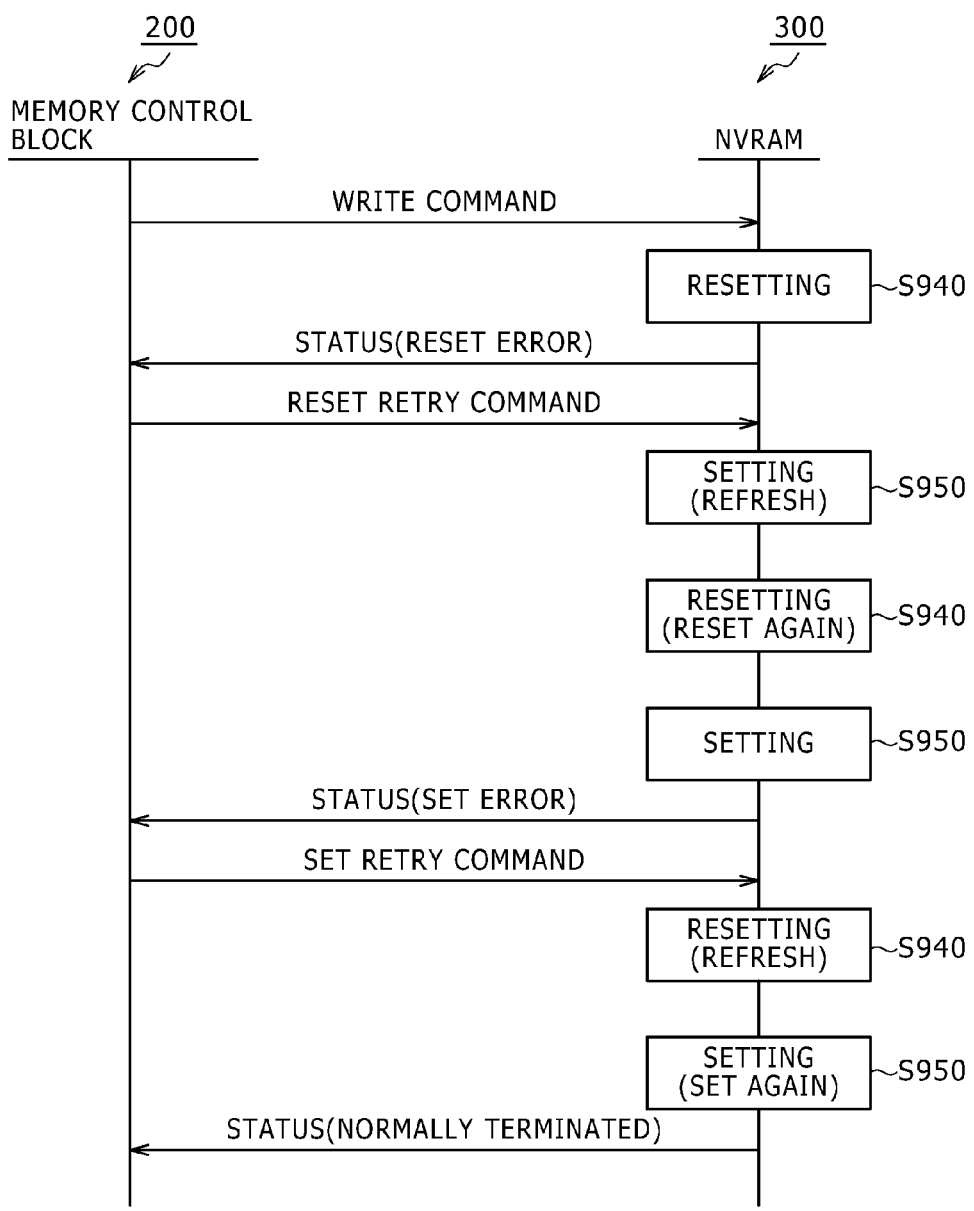
FIG. 15 is a sequence diagram illustrating an operation example of a memory system in the first embodiment.

FIG. 15 is a sequence diagram illustrating an operation example of the memory system in the first embodiment. The memory control block 200 in the memory system decodes the write command received from the host computer 100, transferring the decoded command to the NVRAM 300. Then, the NVRAM 300 performs resetting according to the write command (step S940).

If a reset error occurs during resetting, the NVRAM 300 transfers a status including a reset error to the memory control block 200. The same section 200 issues a reset retry command according to the reset error, transferring the command to the NVRAM 300. The NVRAM 300 performs setting (refresh setting) of the reset memory cell according to the reset retry command (step S950). Next, the NVRAM 300 performs resetting adapted to reset again the memory cell that has been reset (step S940).

If the second resetting is normally terminated, the NVRAM 300 performs setting (step S950). If a set error occurs during setting, the NVRAM 300 transfers a status including a set error to the memory control block 200. The same section 200 issues a set retry command according to the set error, transferring the command to the NVRAM 300. The NVRAM 300 performs resetting (refresh resetting) of the reset memory cell according to the set retry command (step S940). Next, the NVRAM 300 performs resetting adapted to set again the memory cell that has been set (step S950).

As described above, if the NVRAM 300 sets the memory cell before resetting it again (refresh setting), it is possible to provide the memory cell that has detected a reset error with improved data holding capability. Similarly, if the NVRAM 300 resets the memory cell before setting it again (refresh resetting), it is possible to provide the memory cell that has detected a set error with improved data holding capability. This contributes to higher probability of successful second resetting or setting than when no refresh is performed, thus suppressing the increase in number of defective cells.

Figure 16:
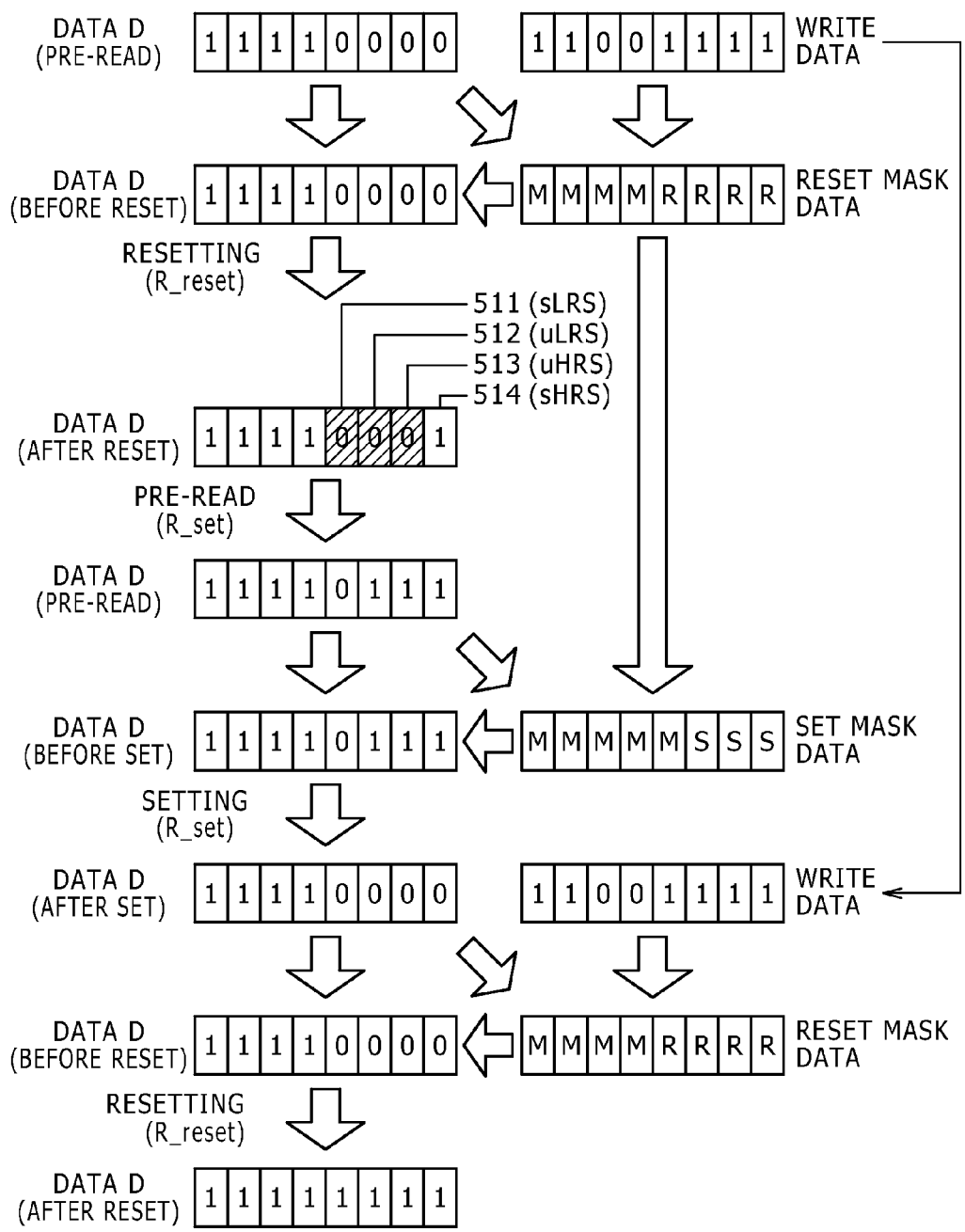
FIG. 16 is a diagram illustrating a specific example of data whose resetting is retried in the first embodiment.

FIG. 16 is a diagram illustrating a specific example of data whose resetting is retried in the first embodiment. We assume a case in which the NVRAM 300 receives, from the memory control block 200, a write command instructing that write data of "0b11001111" be written. Here, "0b" at the beginning indicates that this numerical value is binary. In this case, the NVRAM 300 performs a pre-read with respect to the high-resistance threshold R_reset. We assume that "0b11110000" has been pre-read as data D that had already been written to the address specified by the write command. The bits whose contents in the data D are "0s" and whose contents in the write data are "1s" are the 5th to 8th bits. The NVRAM 300 generates reset mask data of "MMMMRRRR" adapted to reset these 5th to 8th bits. Here, "R" represents the bits to be reset, and "M" the bits to be masked.

The NVRAM 300 performs resetting based on the reset mask data. After the resetting, the NVRAM 300 performs verification with respect to the high-resistance threshold R_reset. We assume that data of "0b11110001" has been read in the verification. Of the bits to be reset, the 8th bit is not reset. Therefore, the NVRAM 300 determines that a reset error has occurred. Here, if the verification is performed with respect to the high-resistance threshold R_reset, "1s" are read from those memory cells in the stable and high-resistance state (sHRS), and "0s" from the memory cells in any other state. Therefore, a memory cell 514 from which a value of "1" has been read as the content of the 8th bit is in the stable and high-resistance state (sHRS). On the other hand, the 5th to 7th bits from which a value of "0" has been read is in one of the stable and low-resistance state (sLRS), unstable and low-resistance state (uLRS) and unstable and high-resistance state (uHRS). For example, a memory cell 511, i.e., the 5th bit, is in the sLRS. A memory cell 512, i.e., the 6th bit, is in the uLRS. A memory cell 513, i.e., the 7th bit, is in the uHRS.

The NVRAM 300 performs a pre-read with respect to the low-resistance threshold R_set according to a reset retry command issued in response to the reset error. If pre-read is performed with respect to the low-resistance threshold R_set, "0s" are read from those memory cells in the sLRS, and "1s" from the memory cells in any other state. Of the memory cells 511 to 514 that are the 5th to 8th bits, only the memory cell 511 is in the sLRS. Therefore, "0" is read from the 5th bit, and "1" from each of the 6th to 8th bits. As a result, the data D of "0b11110111" is read by the pre-read.

The NVRAM 300 generates set mask data of "MMMMMSSS" by setting the bits that are to be reset in the reset mask data and that are reset in the data D at the same time. Here, "S" represents the bits to be set, and "M" the bits to be masked.

The NVRAM 300 performs setting based on the set mask data. As a result, of the memory cells to be reset, those in any of the uLRS, uHRS and sHRS are set, causing these memory cells to make a transition to the sLRS. Here, those bits of the set mask data that are set (sLRS) are masked. Therefore, the memory cells that are already set will not be set. In general, there is a limit in the number of times a non-volatile memory can be rewritten. As a result, setting performed with those memory cells for which setting is not necessary masked contributes to a longer service life of the non-volatile memory.

If the setting is normally terminated, the data D is rewritten to "0b11110000." The NVRAM 300 generates reset mask data of "MMMMRRRR" from this data D and write data, performing resetting again based on the reset mask data. If the second resetting is normally terminated, the data D is rewritten to "0b11111111." As a result, the memory cells corresponding to the 5th to 8th bits to be reset all make a transition to the sHRS.

Figure 17:
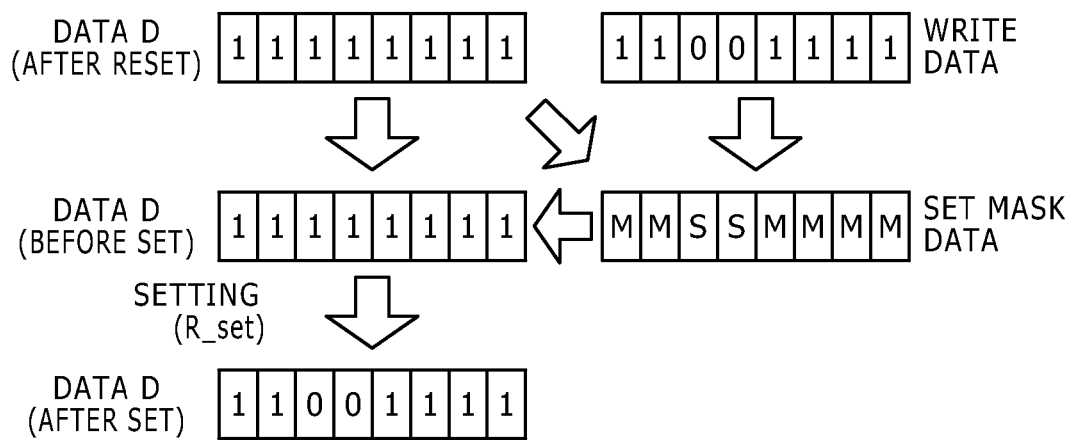
FIG. 17 is a diagram illustrating a specific example of data whose setting is executed in the first embodiment.

FIG. 17 is a diagram illustrating a specific example of data whose setting is performed in the first embodiment. The NVRAM 300 generates set mask data of "MMSSMMMM" from the reset data D of "0b11111111" and the write data. The bits whose contents in the data D are "1s" and whose contents in the write data are "0s" are the 3rd and 4th bits. Therefore, these bits are regarded as the bits to be set in the set mask data.

The NVRAM 300 performs setting based on the set mask data. If the setting is normally terminated, the data D is rewritten to "0b11001111." This completes the writing of write data.

FIGS. 18A to 18C are diagrams illustrating examples of state transitions of memory cells during retry of resetting in the first embodiment. FIG. 18A is a diagram illustrating examples of states of the memory cells when a reset error occurs. The memory cells 511, 512, 513 and 514 are memory cells to be reset. We assume that, as a result of resetting, the memory cell 511 makes a transition to the stable and low-resistance state (sLRS), the memory cell 512 to the unstable and low-resistance state (uLRS), the memory cell 513 to the unstable and high-resistance state (uHRS), and the memory cell 514 to the stable and high-resistance state (sHRS). The verification is performed with respect to the high-resistance threshold R_reset, and a value of "1" is read from the memory cell in the sHRS, and a value of "0" from the memory cells in any other state. Therefore, a reset error is detected from the memory cells 511, 512 and 513 that are not in the sHRS.

FIG. 18B is a diagram illustrating examples of state transitions of the memory cells when setting (refresh setting) is performed according to a retry command. In this setting, those memory cells that are not set (sLRS) with respect to the low-resistance threshold R_set are set. As a result, the memory cells 512, 513 and 514 that are not in the sLRS are set, causing these memory cells to make a transition to the sLRS.

FIG. 18C is a diagram illustrating examples of state transitions of the memory cells when resetting is performed again according to a retry command. In this resetting, those memory cells that have not been reset (sHRS) with respect to the high-resistance threshold R_reset are reset. As a result, the memory cells 511 to 514 that are not in the sHRS are reset, causing these memory cells to make a transition to the sHRS.

As illustrated in FIG. 18, of the memory cells that have developed a reset error, those in any of the uLRS and uHRS, i.e., particularly unstable states, make a transition to the stable and resistance state. This provides improved data holding characteristic, contributing to higher probability of successful second resetting than when no refresh is performed.

As described above, in the first embodiment of the present technology, the NVRAM 300 performs setting first followed by resetting again when a reset error occurs, thus contributing to improved probability of successful second resetting. Further, the NVRAM 300 performs resetting first followed by setting again when a set error occurs, thus contributing to improved probability of successful second setting. This suppresses the increase in number of defective cells.

<2. Second Embodiment>

[Configuration Example of the NVRAM Control Circuit]

Figure 19:
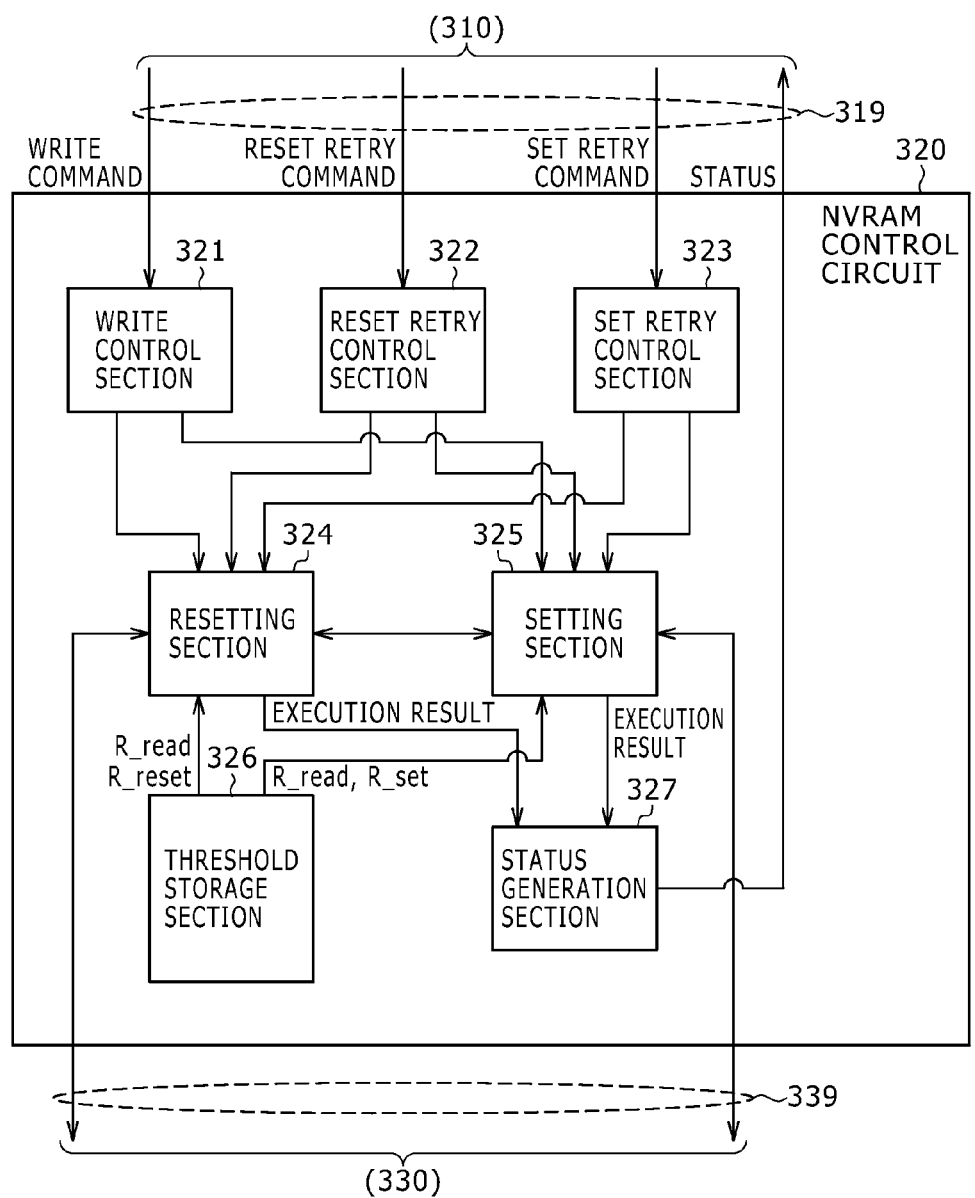
FIG. 19 is a block diagram illustrating a configuration example of the NVRAM control circuit in a second embodiment.

FIG. 19 is a block diagram illustrating a configuration example of the NVRAM control circuit 320 in a second embodiment. The NVRAM 300 according to the first embodiment performs setting of only the memory cells that are in any of the uLRS, uHRS and sHRS except for those in the sHRS for which setting is not necessary during a retry of resetting. However, of the uLRS, uHRS and sHRS, refresh setting is the most effective for the uLRS. Refresh setting is effective to a smaller degree for the memory cells in the uHRS and sHRS than those in the uLRS. More specifically, the extent to which control is exercised to bring the resistance to or below the low-resistance threshold R_set is larger in the uHRS than in the uLRS, thus resulting in higher likelihood of faulty setting than in the uLRS. On the other hand, the extent to which control is exercised to bring the resistance to or above the high-resistance threshold R_reset is smaller in the uHRS than in the uLRS, thus providing higher likelihood of successful second setting. Therefore, setting is effective to a smaller degree for the memory cells in the uHRS than in the uLRS. On the other hand, the sHRS is a stable resistance state and does not provide improved data holding characteristic even when subjected to setting. The NVRAM 300 according to the second embodiment differs from the counterpart according to the first embodiment in that only the resistance state for which the refresh is the most effective makes a transition.

The threshold storage section 326 according to the second embodiment further stores a boundary resistance value R_read. Further, the resetting section 324 according to the second embodiment acquires the boundary resistance value R_read from the threshold storage section 326. Then, the same section 324 performs a pre-read of the set memory cells with respect to the boundary resistance value R_read and a pre-read with respect to the high-resistance threshold R_reset. The resetting section 324 performs resetting of those bits whose values differ in the data read by the two pre-reads. Further, the setting section 325 according to the second embodiment further acquires the boundary resistance value R_read, performing a pre-read of the reset memory cells with respect to the boundary resistance value R_read and a pre-read with respect to the low-resistance threshold R_set. The setting section 325 performs setting of those bits whose values differ in the data read by the two pre-reads.

[Operation Example of the NVRAM]

Figure 20:
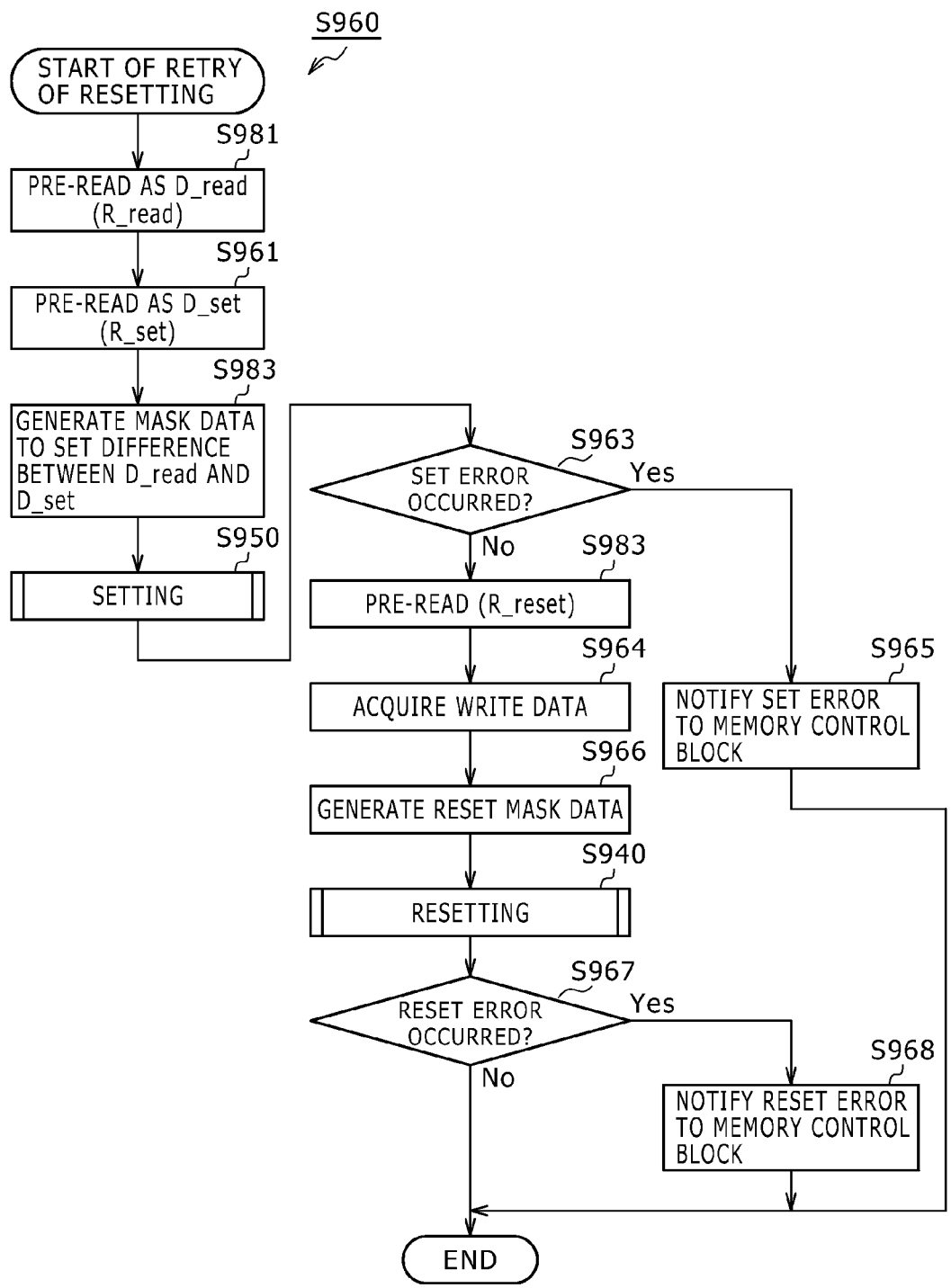
FIG. 20 is a flowchart illustrating an example of retry of resetting in the second embodiment.

FIG. 20 is a flowchart illustrating an example of retry of resetting in the second embodiment. The retry of resetting according to the second embodiment differs from that according to the first embodiment in that steps S981 and S983 are further performed, and that step S982 is performed rather than step S962. The setting section 325 performs a pre-read of the reset memory cells with respect to the boundary resistance value R_read, denoting the data as data D_read (step S981). Then, the same section 325 performs a pre-read with respect to the low-resistance threshold R_set, denoting the data as data D_set (step S961). The setting section 325 generates set mask data adapted to set the bits that make the difference between the data D_read and data D_set (step S982). The same section 325 performs setting based on the set mask data (step S950).

If a set error has not occurred (No in step S963), the resetting section 324 performs a pre-read with respect to the high-resistance threshold R_reset (step S983). The same section 324 acquires write data (step S964), generating reset mask data from the pre-read data and write data (step S966). The resetting section 324 performs the processes from step S940 and beyond based on the reset mask data.

Figure 21:
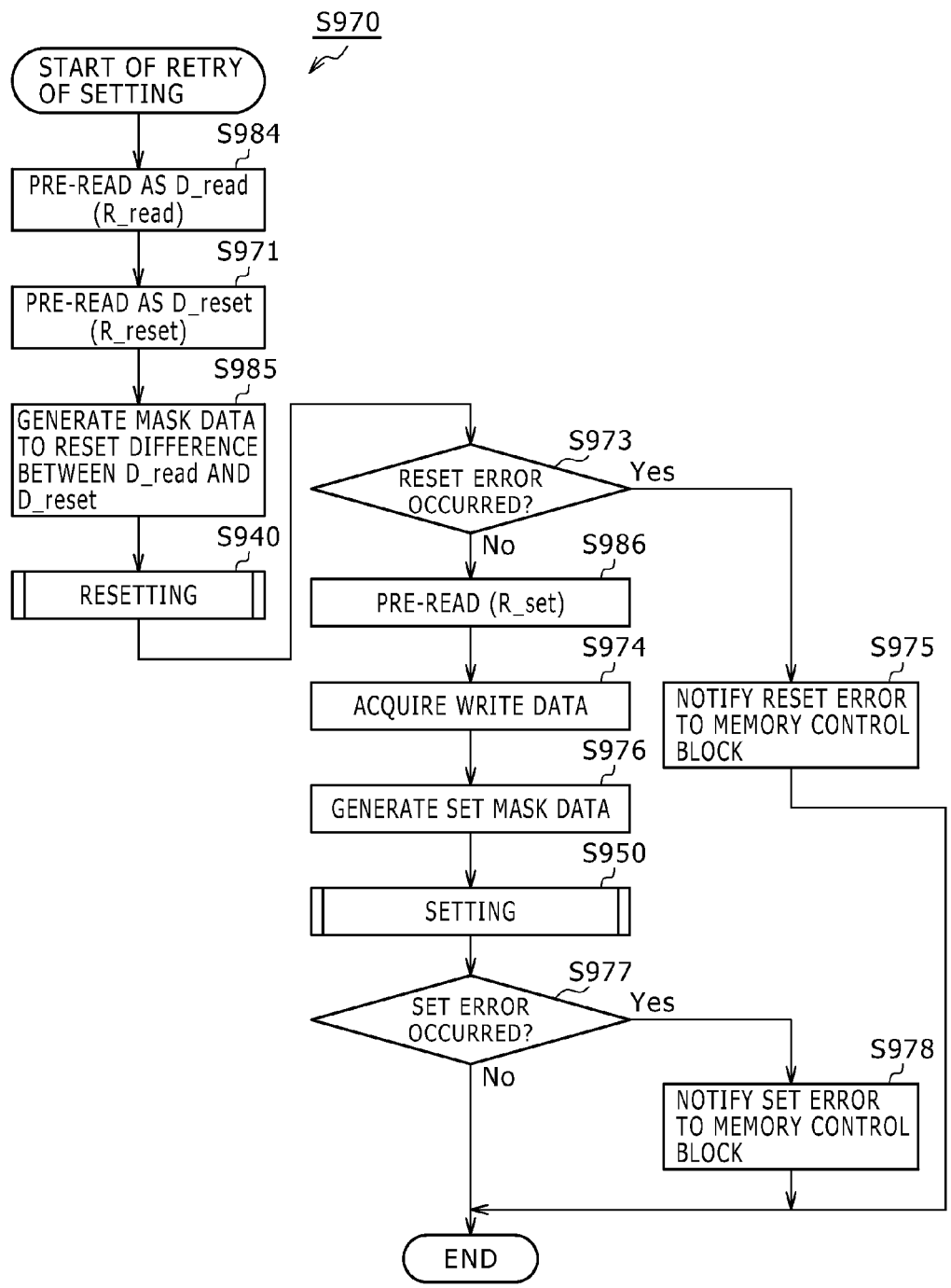
FIG. 21 is a flowchart illustrating an example of retry of setting in the second embodiment.

FIG. 21 is a flowchart illustrating an example of retry of setting in the second embodiment. The retry of setting according to the second embodiment differs from that according to the first embodiment in that steps S984 and S986 are further performed, and that step S985 is performed rather than step S972. The resetting section 324 performs a pre-read of the set memory cells with respect to the boundary resistance value R_read, denoting the data as the data D_read (step S984). Then, the same section 324 performs a pre-read with respect to the high-resistance threshold R_reset, denoting the data as data D_reset (step S971). The resetting section 324 generates reset mask data adapted to reset the bits that make the difference between the data D_read and data D_reset (step S985). The same section 324 performs resetting based on the reset mask data (step S940).

If a reset error has not occurred (No in step S973), the setting section 325 performs a pre-read with respect to the low-resistance threshold R_set (step S986). The same section 325 acquires write data (step S974), generating set mask data from the pre-read data and write data (step S976). The setting section 325 performs the processes from step S950 and beyond based on the set mask data.

Figure 22:
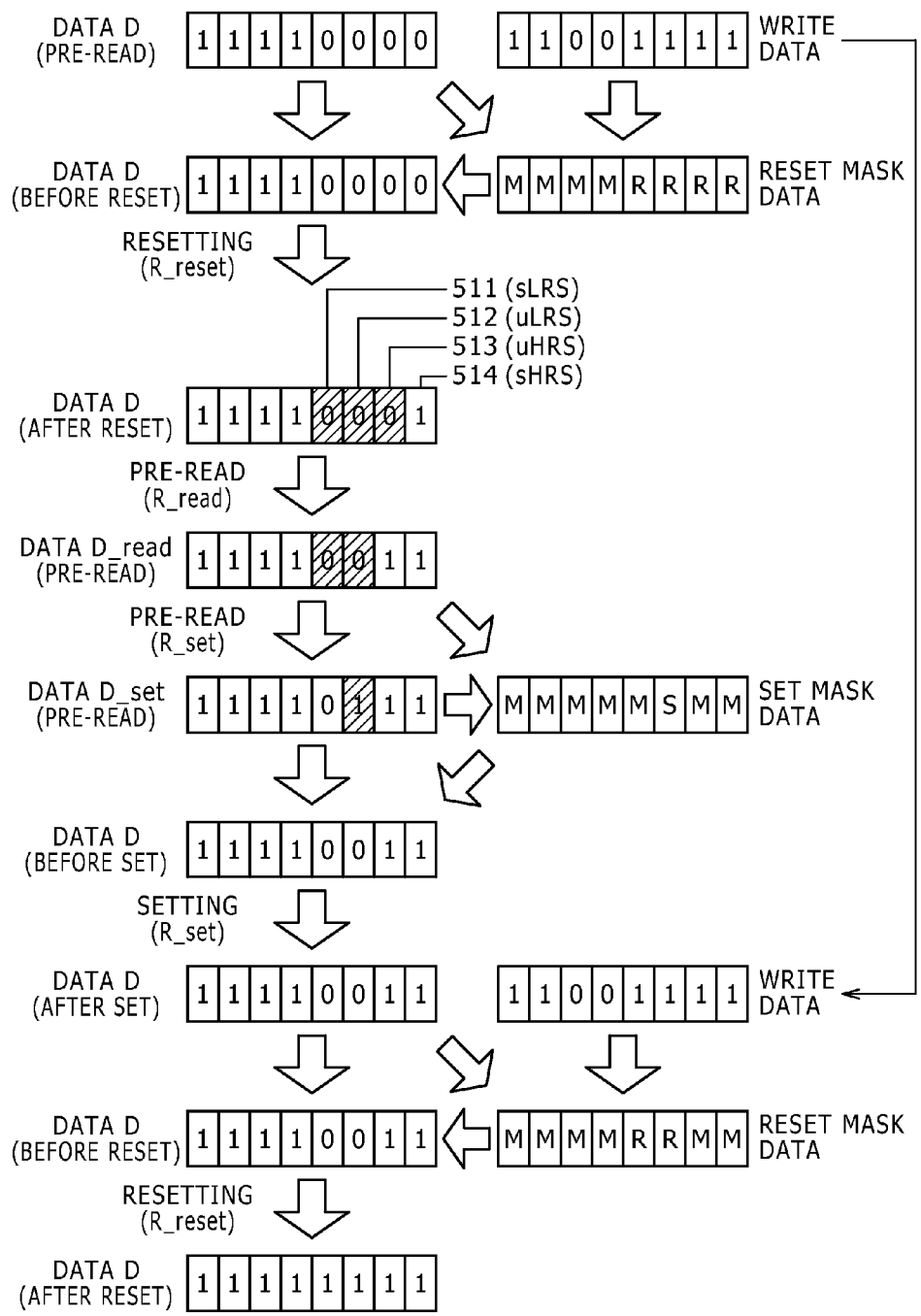
FIG. 22 is a diagram illustrating a specific example of data whose resetting is retried in the second embodiment.

FIG. 22 is a diagram illustrating a specific example of data whose resetting is retried in the second embodiment. As in the first embodiment, the NVRAM 300 generates reset mask data from pre-read data and write data, performing resetting.

If a reset error has occurred, the NVRAM 300 according to the second embodiment performs two pre-reads of the reset memory cells, one with respect to the boundary resistance value R_read and another with respect to the low-resistance threshold R_set. Two pieces of data obtained by the two pre-reads are denoted as the data D_read and data D_set. If the pre-read is performed with respect to the boundary resistance value R_read, "0s" are read from those memory cells in any of the sLRS and uLRS, and "1s" from the memory cells in any other state. On the other hand, if the pre-read is performed with respect to the low-resistance threshold R_set, "0s" are read from those memory cells in the sLRS, and "1s" from the memory cells in any other state. Therefore, different values are read from the memory cell 512 in the uLRS by the pre-reads. This makes it possible to identify the positions of the memory cells in the uLRS by comparing the D_read and D_set. The NVRAM 300 generates set mask data of "MMMMMSMM" adapted to set the 6th bit (512) whose value is different between D_read and D_set. Then, the NVRAM 300 performs setting based on the set mask data in the same manner as in the first embodiment.

As described above, the NVRAM 300 compares the two pieces of data, one pre-read with respect to the boundary resistance value R_read and another pre-read with respect to the low-resistance threshold R_set, thus making it possible to identify the positions of the memory cells in the uLRS. Of the uLRS, uHRS and sHRS, refresh setting based on setting is the most effective for the uLRS. Refresh setting is effective to a smaller degree for the uHRS and sHRS than for the uLRS. Therefore, the NVRAM 300 can perform setting in such a manner that those memory cells in either the uHRS or sHRS, for which setting is not highly effective, are not rewritten, thus contributing to a longer service life of the memory cells.

Similarly, during a retry of setting, the NVRAM 300 compares the two pieces of data, one pre-read with respect to the boundary resistance value R_read and another pre-read with respect to the high-resistance threshold R_reset, thus making it possible to identify the positions of the memory cells for which resetting is the most effective. The NVRAM 300 performs resetting in such a manner that those memory cells, for which resetting is not highly effective, are not rewritten, thus contributing to an even longer service life of the memory cells.

FIGS. 23A to 23C are diagrams illustrating examples of state transitions of the memory cells during retry of resetting in the second embodiment. FIG. 23A is a diagram illustrating examples of states of the memory cells when a reset error occurs. We assume, as in the first embodiment, that, as a result of resetting, the memory cell 511 makes a transition to the stable and low-resistance state (sLRS), the memory cell 512 to the unstable and low-resistance state (uLRS), the memory cell 513 to the unstable and high-resistance state (uHRS), and the memory cell 514 to the stable and high-resistance state (sHRS). As a result of the verification performed with respect to the high-resistance threshold R_reset, a reset error is detected from the memory cells 511, 512 and 513 that are not in the sHRS.

FIG. 23B is a diagram illustrating examples of state transitions of the memory cells when refresh setting is performed according to a retry command. In this setting, the two pieces of data, one pre-read with respect to the boundary resistance value R_read and another pre-read with respect to the low-resistance threshold R_set, are compared, identifying the memory cell 511 in the uLRS for which setting is the most effective. Then, only the memory cell 512 in the uLRS is set, causing this memory cell to make a transition to the sLRS.

FIG. 23C is a diagram illustrating examples of state transitions of the memory cells when resetting is performed again according to a retry command. In this resetting, those memory cells that are not in a reset state (sHRS) with respect to the high-resistance threshold R_reset are reset. As a result, the memory cells 511 to 513 that are not in the sHRS are reset, causing these memory cells to make a transition to the sHRS.

As illustrated in FIG. 23, two pieces of data, one pre-read with respect to the boundary resistance value R_read and another pre-read with respect to the low-resistance threshold R_set, are compared, identifying the memory cell 511 in the uLRS for which setting is the most effective. This makes it possible to mask those memory cells for which setting is not highly effective, thus contributing to an even longer service life of the memory cells.

As described above, in the second embodiment of the present technology, the NVRAM 300 compares two pieces of data, one read with respect to the boundary resistance value and another read with respect to the low-resistance threshold, performing setting with those memory cells for which setting is not comparatively effective masked. Further, the NVRAM 300 compares two pieces of data, one read with respect to the boundary resistance value and another read with respect to the high-resistance threshold, performing resetting with those memory cells for which resetting is not comparatively effective masked. This eliminates the likelihood of those memory cells for which resetting is not highly effective being reset, thus providing a reduced number of times these memory cells are rewritten. This contributes to an even longer service life of the memory cells, as compared to the first embodiment.

<3. Third Embodiment>

[Configuration Example of the Memory Control Circuit]

Figure 24:
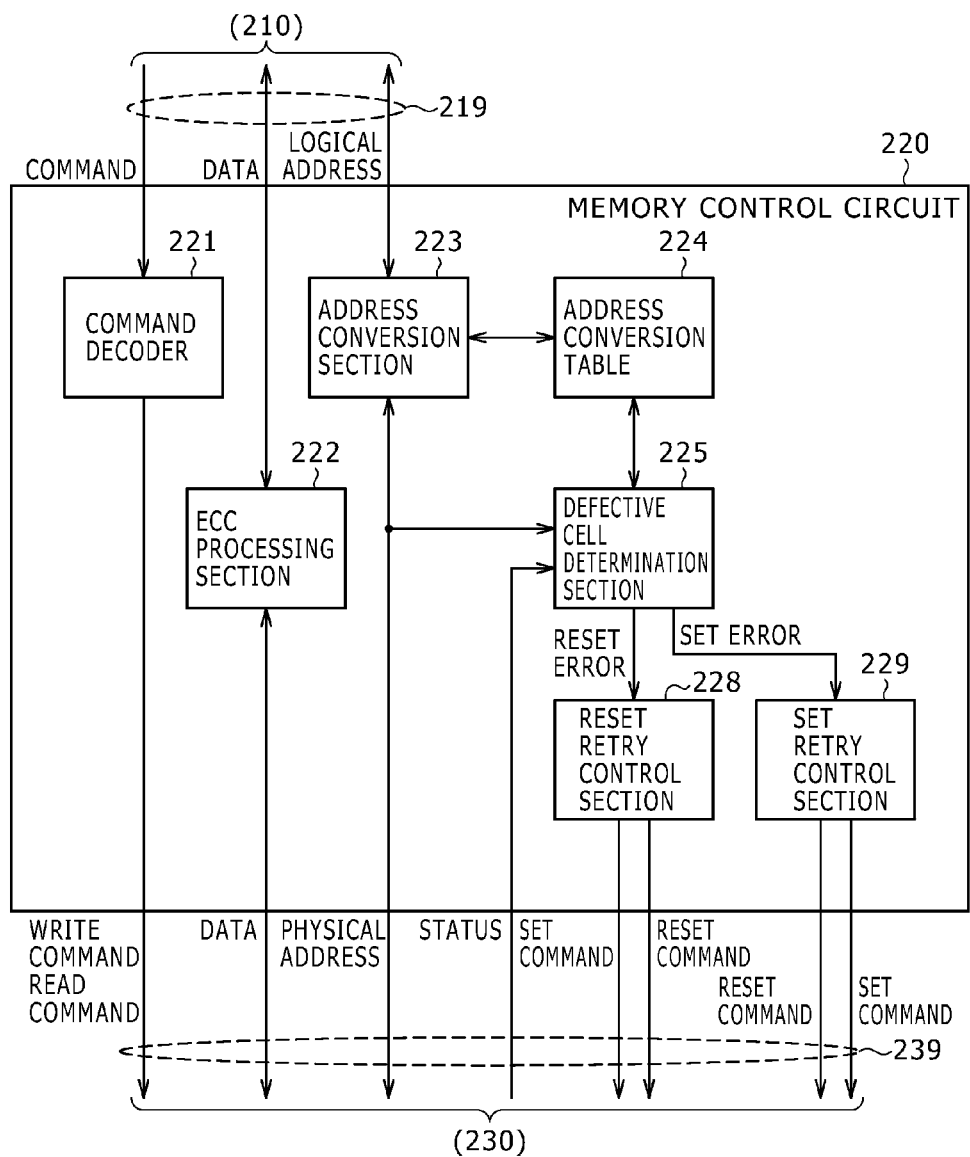
FIG. 24 is a block diagram illustrating a configuration example of the memory control circuit in a third embodiment.

FIG. 24 is a block diagram illustrating a configuration example of the memory control circuit 220 in a third embodiment. In the first embodiment, the NVRAM 300 controls retries of resetting and setting. These control tasks can be handled by the memory control block 200. The memory control block 200 according to the third embodiment differs from the counterpart according to the first embodiment in that the same section 200 rather than the NVRAM 300 controls the retries of resetting and setting. More specifically, the memory control circuit 220 includes a reset retry control section 228 and set retry control section 229 rather than the reset retry command issuance section 226 and set retry command issuance section 227. The reset retry control section 228 and set retry control section 229 are identical in configuration respectively to the reset retry control section 322 and set retry control section 323 provided in the NVRAM 300 according to the first embodiment. It should be noted that although the write command, reset command and set command are shown to be transferred via different signal lines in FIG. 24 for the convenience of description, these commands are actually transferred via the same signal line.

[Configuration Example of the NVRAM Control Circuit]

Figure 25:
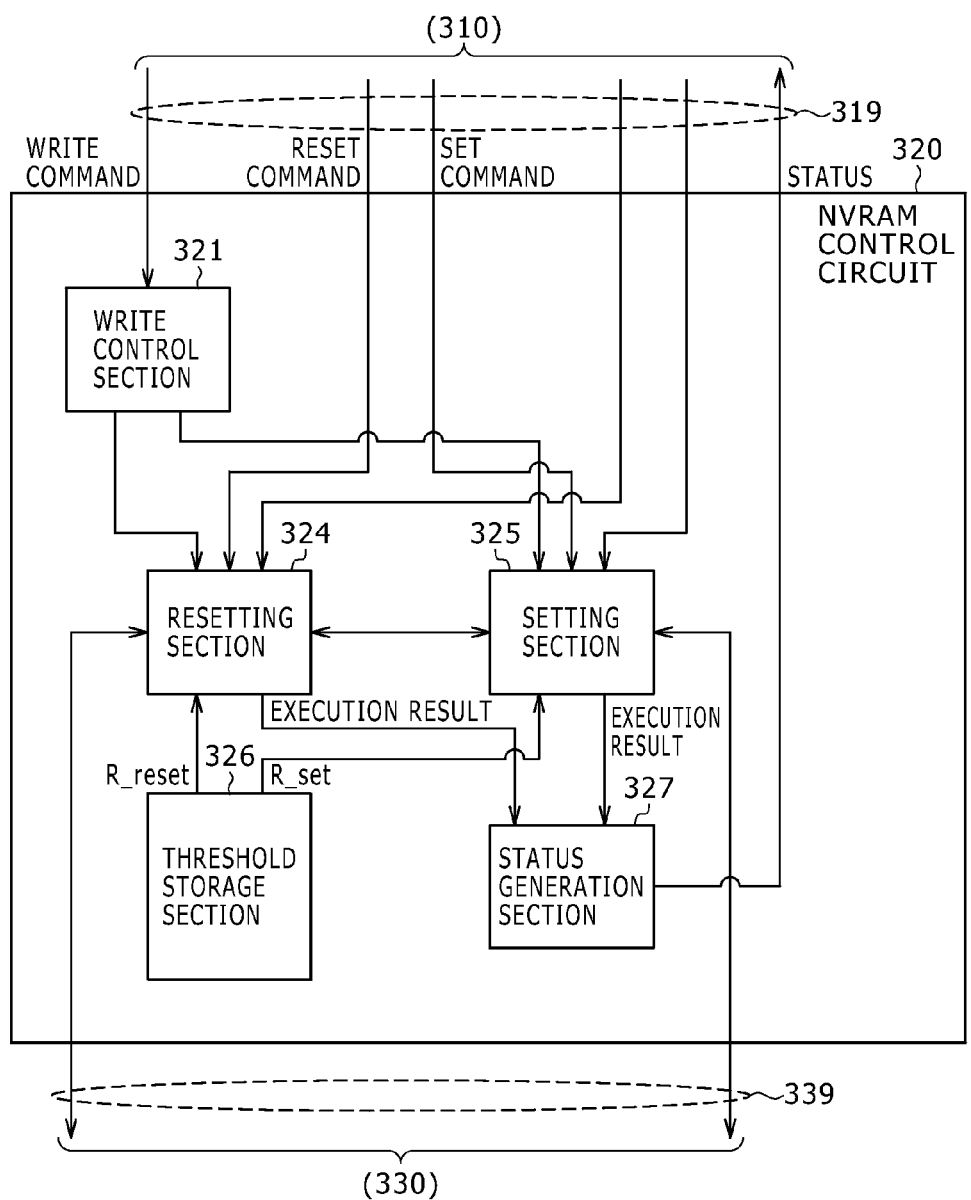
FIG. 25 is a block diagram illustrating a configuration example of the NVRAM control circuit in the third embodiment.

FIG. 25 is a block diagram illustrating a configuration example of the NVRAM control circuit 320 in the third embodiment. The same circuit 320 according to the third embodiment differs from the counterpart according to the first embodiment in that it does not include the reset retry control section 322 or set retry control section 323.

[Operation Example of the Memory Control Block]

Figure 26:
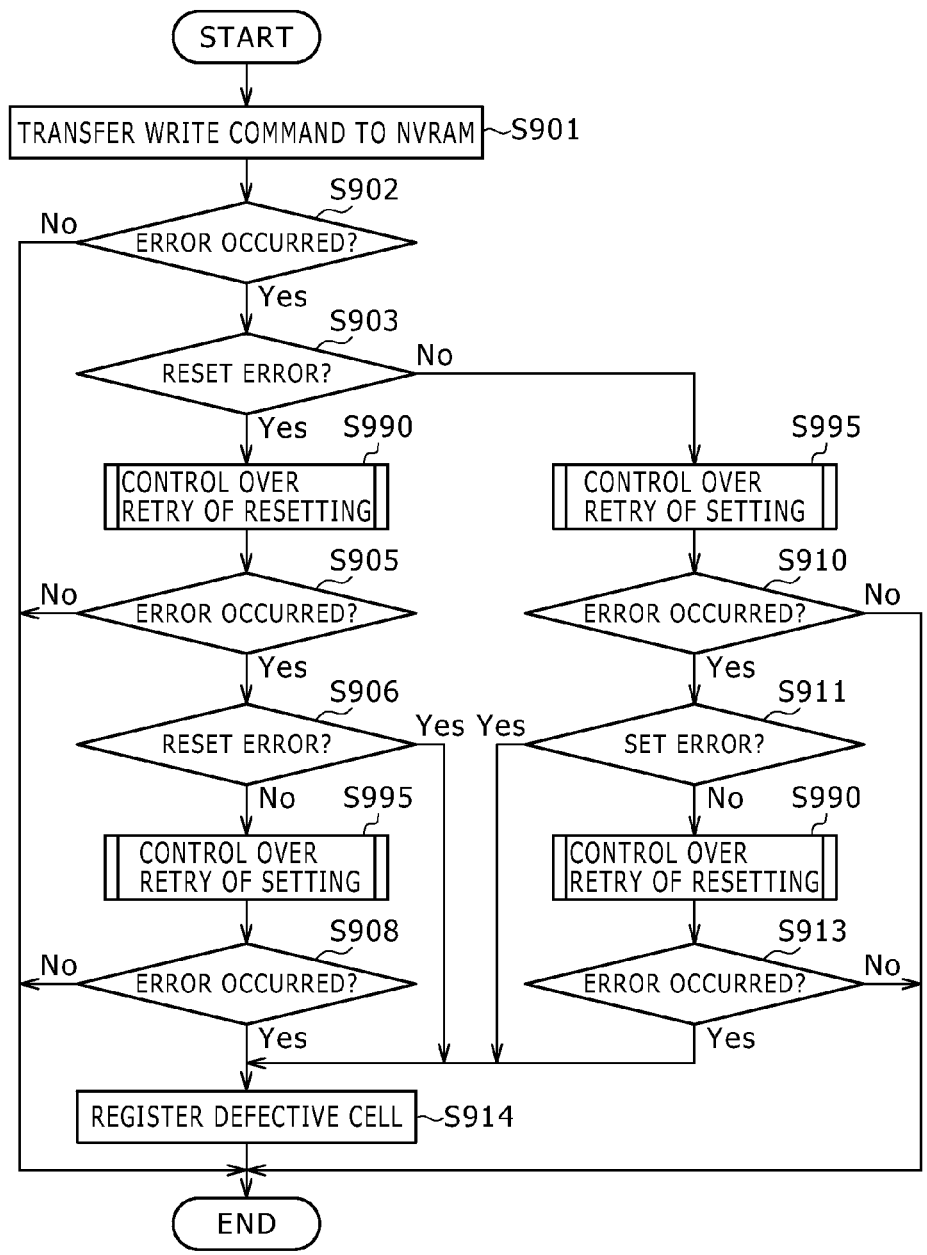
FIG. 26 is a flowchart illustrating an operation example of the memory control block in the third embodiment.

FIG. 26 is a flowchart illustrating an operation example of the memory control block 200 in the third embodiment. The operation of the memory control block 200 according to the third embodiment differs from that of the counterpart according to the first embodiment in that step S990 is performed rather than steps S904 and S912, and that step S995 is performed rather than steps S907 and S909.

If the first error is a reset error (Yes in step S903), the reset retry control section 228 exercises control over the retry of resetting (step S990). On the other hand, if the first error is a set error (No in step S903), the set retry control section 229 exercises control over the retry of setting (step S995).

If the second error is a set error (No in step S906), the set retry control section 229 exercises control over the retry of setting (step S995). On the other hand, if the second error is a reset error (No in step S911), the reset retry control section 228 exercises control over the retry of resetting (step S990).

Figure 27:
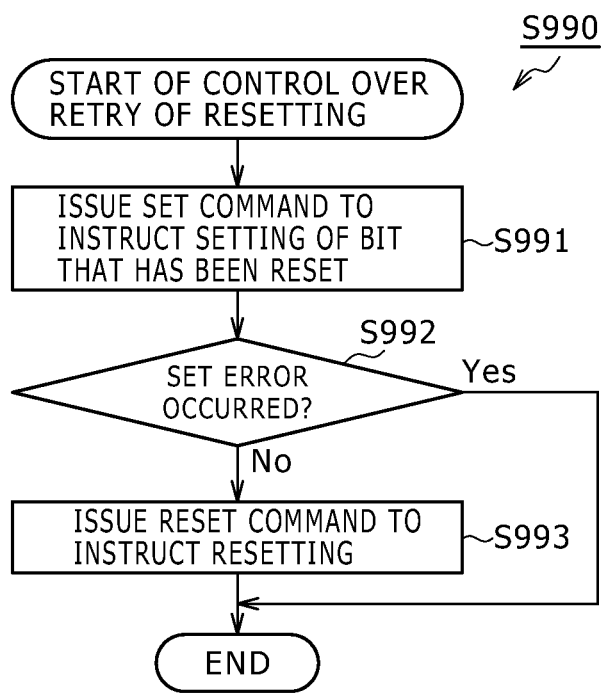
FIG. 27 is a flowchart illustrating an example of control over retry of resetting in the third embodiment.

FIG. 27 is a flowchart illustrating an example of control over retry of resetting in the third embodiment. The reset retry control section 228 issues a set command to instruct that all the reset bits be set (step S991). The same section 228 determines whether a set error has occurred (step S992). If a set error has not occurred (No in step S992), the reset retry control section 228 transmits the write data again and issues a reset command to instruct that resetting be performed, supplying the command to the NVRAM 300 (step S993). If a set error has occurred (Yes in step S992) or after step S993 is performed, the same section 228 terminates control over the retry of resetting.

Figure 28:
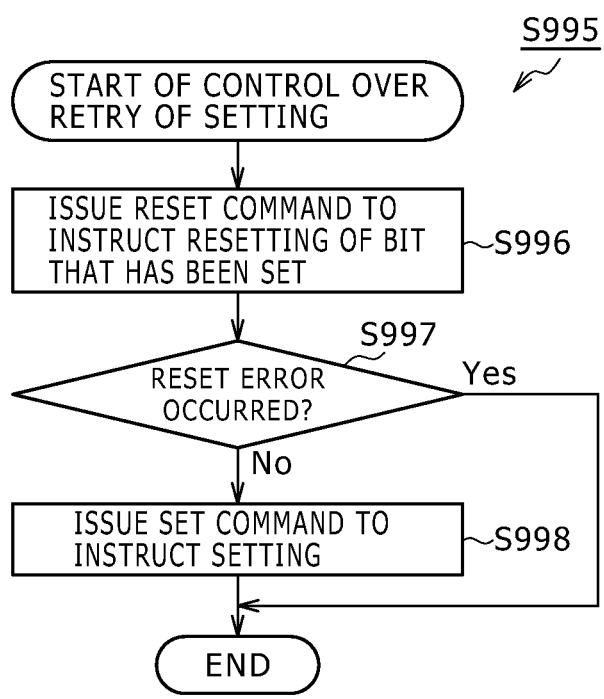
FIG. 28 is a flowchart illustrating an example of control over retry of setting in the third embodiment.

FIG. 28 is a flowchart illustrating an example of control over retry of setting in the third embodiment. The set retry control section 229 issues a reset command to instruct that all the set bits be reset (step S996). The same section 229 determines whether a reset error has occurred (step S997). If a reset error has not occurred (No in step S997), the set retry control section 229 transmits the write data again and issues a set command to instruct that setting be performed, supplying the command to the NVRAM 300 (step S998). If a reset error has occurred (Yes in step S997) or after step S998 is performed, the same section 229 terminates control over the retry of setting.

[Operation Example of the NVRAM]

Figure 29:
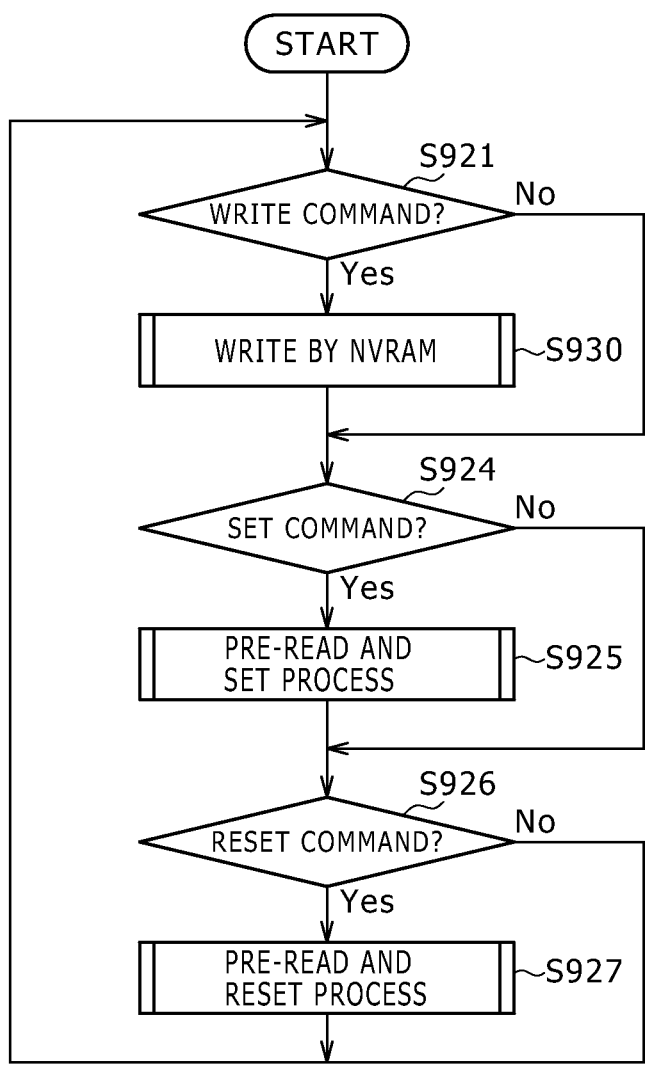
FIG. 29 is a flowchart illustrating an operation example of the NVRAM in the third embodiment.

FIG. 29 is a flowchart illustrating an operation example of the NVRAM 300 in the third embodiment. The operation of the NVRAM 300 according to the third embodiment differs from that of the counterpart according to the first embodiment in that steps S924 to S927 are performed rather than steps S922, S923, S960 and S970.

If a write command has not been received (No in step S921) or after step S930 is performed, the setting section 325 determines whether a set command has been received from the memory control block 200 (step S924). If a set command has been received (Yes in step S924), the same section 325 performs pre-read and setting (S925).

If a set command has not been received (No in step S924) or after step S925 is performed, the resetting section 324 determines whether a reset command has been received from the memory control block 200 (step S926). If a reset command has been received (Yes in step S926), the same section 324 performs pre-read and resetting (S927). If a reset command has not been received (No in step S926) or after step S927 is performed, the NVRAM 300 returns to step S921.

Figure 30:
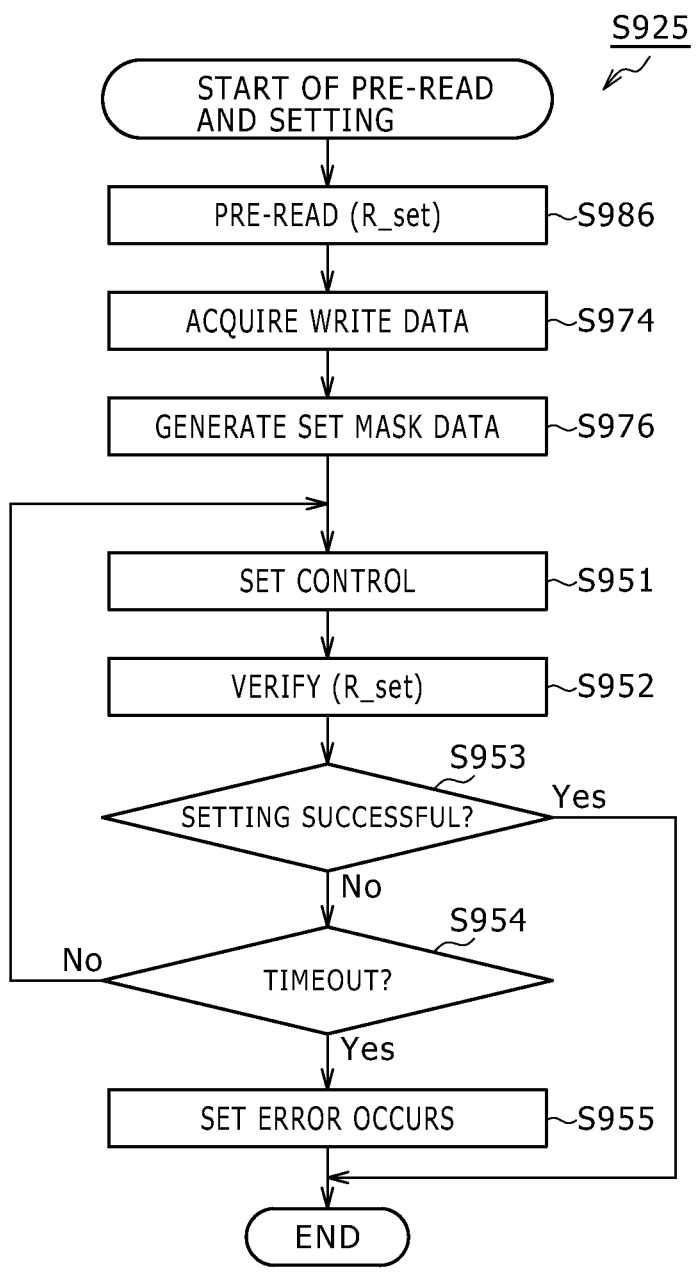
FIG. 30 is a flowchart illustrating an example of pre-read and setting in the third embodiment.

FIG. 30 is a flowchart illustrating an example of pre-read and setting in the third embodiment. The setting section 325 performs a pre-read with respect to the low-resistance threshold R_set (step S986). The same section 325 acquires write data (step S974), generating set mask data from the pre-read data and write data (step S976). The setting section 325 performs steps S951 to S955 based on the set mask data. Steps S951 to S955 are identical to setting (step S950) in the first embodiment.

FIG. 31 is a flowchart illustrating an example of pre-read and resetting in the third embodiment. The resetting section 324 performs a pre-read with respect to the high-resistance threshold R_reset (step S983). The same section 324 acquires write data (step S964), generating reset mask data from the pre-read data and write data (step S966). The resetting section 324 performs steps S941 to S945 based on the reset mask data. Steps S941 to S945 are identical to resetting (step S940) in the first embodiment.

As described above, in the third embodiment, the memory control block 200 includes the reset retry control section 228 and set retry control section 229, thus making it possible to control retries of resetting and setting in place of the NVRAM 300. This provides a simple configuration of the NVRAM 300. Further, even if the memory control block 200 controls the plurality of NVRAMs 300, it is only necessary to provide the reset retry control section 228 and set retry control section 229 in the memory control block 200. This provides a simpler configuration of the memory system as a whole than when each of the NVRAMs 300 controls retries.

It should be noted that a reset retry control section and set retry control section may be provided in the host computer 100 so that the same computer 100, rather than the memory control block 200, controls retries.

It should be noted that the above embodiments are merely examples of implementing the present technology. There are correspondences between the features of the embodiments of the present technology and the specific features of the technology set forth in the appended claims. Similarly, there are correspondences between the specific features of the technology set forth in the appended claims and the identically named features of the embodiments of the present technology. It should be noted, however, that the present technology is not limited to the embodiments but may be implemented by modifying the embodiments in various manners without departing from the scope of the present technology.

On the other hand, the process steps described in the above embodiments may be interpreted as a method having a series of steps, a program adapted to cause a computer to perform the series of steps or a storage media storing the program. Among the types of storage media that can be used are a CD (Compact Disc), MD (MiniDisc), DVD (Digital Versatile Disk), memory card and Blu-ray Disc (registered trademark).

It should be noted that the present technology may have the following configurations.

(1) A storage control device including:
a first rewriting section adapted to perform first rewrite to rewrite other of two binary values into a memory cell in which one of the two binary values is written;
a second rewriting section adapted to perform second rewrite to rewrite the one of the two binary values into the memory cell in which the other of the two binary values is written; and
a first retry control section adapted to cause the memory cell that has undergone the first rewrite to be subjected to the second rewrite followed by the first rewrite again if an error occurs during the first rewrite.

(2) The storage control device according to feature (1) further including:
a second retry control section adapted to cause the memory cell that has undergone the second rewrite to be subjected to the first rewrite followed by the second rewrite if an error occurs during the second rewrite.

(3) The storage control device according to feature (2), wherein
the memory cell is a variable resistance element in which one of two resistance states, demarcated by a given boundary resistance value, is associated with the one of the two values, and the other resistance state is associated with the other of the two values,
the first rewriting section reads data from the memory cell with respect to a first resistance value set to the other resistance state by the boundary resistance value and determines that the error has occurred if the data value is not the other of the two values, and the second rewriting section reads data from the memory cell with respect to a second resistance value set to the one of the two resistance states by the boundary resistance value and determines that the error has occurred if the data value is not the one of the two values.

(4) The storage control device according to feature (3) further including:

a defective cell determination section adapted to determine whether the memory cell is defective based on the number of times the error has been detected in each of the first and second rewriting sections.

(5) The storage control device according to feature (3) or (4), wherein the first rewriting section reads first data from the memory cell that has undergone the second rewrite with respect to the first resistance value and performs the first rewrite if the first data value is the one of the two values, and the second rewriting section reads second data from the memory cell that has undergone the first rewrite with respect to the second resistance value and performs the second rewrite if the second data value is the other of the two values.

(6) The storage control device according to feature (3) or (4), wherein the first rewriting section reads not only the first data from the memory cell that has undergone the second rewrite with respect to the first resistance value but also third data with respect to the boundary resistance threshold and performs the first rewrite if the first and third data values are different, and the second rewriting section reads not only second data from the memory cell that has undergone the first rewrite with respect to the second resistance value but also the third data and performs the second rewrite if the second and third data values are different.

(7) A memory system including:
a storage control device; and
a first command issuance section adapted to issue the given command if the first error occurs,
the storage control device having
a first rewriting section adapted to perform first rewrite to rewrite other of two binary values into a memory cell in which one of the two binary values is written,
a second rewriting section adapted to perform second rewrite to rewrite the one of the two binary values into the memory cell in which the other of the two binary values is written, and
a retry control section adapted to cause the memory cell that has undergone the first rewrite to be subjected to the second rewrite followed by the first rewrite again in accordance with a given command if an error occurs during the first rewrite.

(8) A memory system including:
a storage control device; and
a first retry control section adapted to cause the memory cell that has undergone the first rewrite to be subjected to the second rewrite followed by the first rewrite again if an error occurs during the first rewrite,
the storage control device having
a first rewriting section adapted to perform first rewrite to rewrite other of two binary values into a memory cell in which one of the two binary values is written, and
a second rewriting section adapted to perform second rewrite to rewrite the one of the two binary values into the memory cell in which the other of the two binary values is written.

(9) An information processing system including:
a storage control device; and
a host computer adapted to issue the given command if the first error occurs,
the storage control device having
a first rewriting section adapted to perform first rewrite to rewrite other of two binary values into a memory cell in which one of the two binary values is written,
a second rewriting section adapted to perform second rewrite to rewrite the one of the two binary values into the memory cell in which the other of the two binary values is written, and
a retry control section adapted to cause the memory cell that has undergone the first rewrite to be subjected to the second rewrite followed by the first rewrite again in accordance with a given command if an error occurs during the first rewrite.

(10) An information processing system including:
a storage control device; and
a host computer adapted to cause the memory cell that has undergone the first rewrite to be subjected to the second rewrite followed by the first rewrite again if an error occurs during the first rewrite,
the storage control device having
a first rewriting section adapted to perform first rewrite to rewrite other of two binary values into a memory cell in which one of the two binary values is written, and
a second rewriting section adapted to perform second rewrite to rewrite the one of the two binary values into the memory cell in which the other of the two binary values is written.

(11) A storage control method including:
performing first rewrite to rewrite other of two binary values into a memory cell in which one of the two binary values is written;
performing second rewrite to rewrite the one of the two binary values into the memory cell in which the other of the two binary values is written; and
causing the memory cell that has undergone the first rewrite to be subjected to the second rewrite followed by the first rewrite again if an error occurs during the first rewrite.

The present disclosure contains subject matter related to that disclosed in Japanese Priority Patent Application JP 2012-098316 filed in the Japan Patent Office on Apr. 24, 2012, the entire content of which is hereby incorporated by reference.

What is claimed is:

1. A storage control device comprising:
a first rewriting section adapted to perform a first rewrite to rewrite another of two binary values into a memory cell in which one of the two binary values is written;
a second rewriting section adapted to perform second rewrite to rewrite the one of the two binary values into the memory cell in which the other of the two binary values is written; and
a first retry control section adapted to cause the memory cell that has undergone the first rewrite to be subjected to the second rewrite to rewrite the one of the two binary values followed by the first rewrite again if an error occurs during the first rewrite to rewrite the other of the two binary values.

2. The storage control device according to claim 1, further comprising:
a second retry control section adapted to cause the memory cell that has undergone the second rewrite to be subjected to the first rewrite to rewrite the other of the two binary values followed by the second rewrite if an error occurs during the second rewrite.

3. The storage control device according to claim 2, wherein the memory cell is a variable resistance element in which one of two resistance states, demarcated by a given boundary resistance value, is associated with the one of the two binary values, and the other of the two resistance states is associated with the other of the two binary values, wherein the first rewriting section reads data from the memory cell with respect to a first resistance value set to the other of the two resistance states by the boundary resistance value and determines that the error has occurred if the data value is not the other of the two binary values, and wherein the second rewriting section reads data from the memory cell with respect to a second resistance value set to the one of the two resistance states by the boundary resistance value and determines that the error has occurred if the data value is not the one of the two binary values.

4. The storage control device according to claim 3, further comprising:

a defective cell determination section adapted to determine whether the memory cell is defective based on a number of times the error has been detected in each of the first rewriting section and the second rewriting section.

5. The storage control device according to claim 3, wherein the first rewriting section reads first data from the memory cell that has undergone the second rewrite with respect to the first resistance value and performs the first rewrite if the first data value is the one of the two binary values, and the second rewriting section reads second data from the memory cell that has undergone the first rewrite with respect to the second resistance value and performs the second rewrite if the second data value is the other of the two binary values.

6. The storage control device according to claim 3, wherein the first rewriting section reads first data from the memory cell that has undergone the second rewrite with respect to the first resistance value and third data with respect to a boundary resistance threshold, and performs the first rewrite if the first data and the third data are different, and wherein the second rewriting section reads second data from the memory cell that has undergone the first rewrite with respect to the second resistance value and the third data with respect to the boundary resistance threshold, and performs the second rewrite if the second data and the third data are different.

7. A memory system comprising:
a storage control device; and
a first command issuance section adapted to issue a command if an error occurs, wherein the storage control device includes:
a first rewriting section adapted to perform a first rewrite to rewrite another of two binary values into a memory cell in which one of the two binary values is written;
a second rewriting section adapted to perform second rewrite to rewrite the one of the two binary values into the memory cell in which the other of the two binary values is written; and
a retry control section adapted to cause the memory cell that has undergone the first rewrite to be subjected to the second rewrite to rewrite the one of the two binary values followed by the first rewrite again in accordance with the command if the error occurs during the first rewrite to rewrite the other of the two binary values.

8. A memory system comprising:
a storage control device; and
a retry control section adapted to cause a memory cell that has undergone a first rewrite to be subjected to a second rewrite to rewrite one of the two binary values followed by the first rewrite again if an error occurs during the first rewrite to rewrite another of the two binary values, wherein the storage control device includes:
a first rewriting section adapted to perform the first rewrite to rewrite the other of two binary values into the memory cell in which the one of the two binary values is written; and
a second rewriting section adapted to perform the second rewrite to rewrite the one of the two binary values into the memory cell in which the other of the two binary values is written.

9. An information processing system comprising:
a storage control device; and
a host computer adapted to issue a command if an error occurs, wherein the storage control device includes:
a first rewriting section adapted to perform a first rewrite to rewrite another of two binary values into a memory cell in which one of the two binary values is written;
a second rewriting section adapted to perform a second rewrite to rewrite the one of the two binary values into the memory cell in which the other of the two binary values is written; and
a retry control section adapted to cause the memory cell that has undergone the first rewrite to be subjected to the second rewrite to rewrite the one of the two binary values followed by the first rewrite again in accordance with the command if the error occurs during the first rewrite to rewrite the other of the two binary values.

10. An information processing system comprising:
a storage control device; and
a host computer adapted to cause a memory cell that has undergone a first rewrite to be subjected to a second rewrite to rewrite one of the two binary values followed by the first rewrite again if an error occurs during the first rewrite to rewrite another of the two binary values, wherein the storage control device includes:
a first rewriting section adapted to perform the first rewrite to rewrite the other of two binary values into the memory cell in which the one of the two binary values is written; and
a second rewriting section adapted to perform the second rewrite to rewrite the one of the two binary values into the memory cell in which the other of the two binary values is written.

11. A storage control method comprising:
performing a first rewrite to rewrite another of two binary values into a memory cell in which one of the two binary values is written;
performing a second rewrite to rewrite the one of the two binary values into the memory cell in which the other of the two binary values is written; and
causing the memory cell that has undergone the first rewrite to be subjected to the second rewrite to rewrite the one of the two binary values followed by the first rewrite again if an error occurs during the first rewrite to rewrite the other of the two binary values.

12. A storage control device comprising:
a first rewriting section adapted to perform a first rewrite to rewrite another of two binary values into a memory cell in which one of the two binary values is written;

a second rewriting section adapted to perform second rewrite to rewrite the one of the two binary values into the memory cell in which the other of the two binary values is written;

a first retry control section adapted to cause the memory cell that has undergone the first rewrite to be subjected to the second rewrite followed by the first rewrite again if an error occurs during the first rewrite;

a second retry control section adapted to cause the memory cell that has undergone the second rewrite to be subjected to the first rewrite followed by the second rewrite if an error occurs during the second rewrite;

wherein the memory cell is a variable resistance element in which one of two resistance states, demarcated by a given boundary resistance value, is associated with the one of the two binary values, and the other resistance state is associated with the other of the two binary values;

wherein the first rewriting section reads data from the memory cell with respect to a first resistance value set to the other resistance state by the boundary resistance value and determines that the error has occurred if the data value is not the other of the two binary values;

wherein the second rewriting section reads data from the memory cell with respect to a second resistance value set to the one of the two resistance states by the boundary resistance value and determines that the error has occurred if the data value is not the one of the two binary values;

wherein the first rewriting section reads first data from the memory cell that has undergone the second rewrite with respect to the first resistance value and performs the first rewrite if the first data value is the one of the two binary values; and wherein the second rewriting section reads second data from the memory cell that has undergone the first rewrite with respect to the second resistance value and performs the second rewrite if the second data value is the other of the two binary values.

* * * * *